United States Patent
Iizuka et al.

(10) Patent No.: US 7,158,210 B2
(45) Date of Patent: Jan. 2, 2007

(54) PROJECTION EXPOSURE APPARATUS

(75) Inventors: Kazuo Iizuka, Kanagawa (JP); Junji Isohata, Tokyo (JP); Nobuyoshi Tanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 10/762,481

(22) Filed: Jan. 23, 2004

(65) Prior Publication Data

US 2004/0150805 A1 Aug. 5, 2004

(30) Foreign Application Priority Data

Jan. 31, 2003 (JP) ............................. 2003-025086

(51) Int. Cl.
  *G03B 27/42* (2006.01)
  *G03B 27/32* (2006.01)

(52) U.S. Cl. .......................................... 355/53; 355/77

(58) Field of Classification Search ................. 355/53, 355/67, 72, 75, 77; 250/492.2, 548; 430/30, 430/5; 356/399, 400, 401

See application file for complete search history.

(56) References Cited

U.S. PATENT DOCUMENTS

| | | | |
|---|---|---|---|
| 4,530,587 A | 7/1985 | Kosugi et al. ................. 355/53 |
| 4,676,630 A | 6/1987 | Matsushita et al. ............ 355/53 |
| 4,708,466 A | 11/1987 | Isohata et al. ................. 355/53 |
| 4,748,477 A | 5/1988 | Isohata et al. ................. 355/53 |
| 4,749,867 A | 6/1988 | Matsushita et al. ....... 250/442.1 |
| 4,878,086 A | 10/1989 | Isohata et al. ................. 355/77 |
| 4,998,134 A | 3/1991 | Isohata et al. ................. 355/53 |
| 5,150,152 A | 9/1992 | Isohata et al. ................. 355/53 |
| 5,359,389 A | 10/1994 | Isohata ......................... 355/53 |
| 5,412,214 A * | 5/1995 | Suzuki et al. ................ 250/548 |
| 5,705,299 A | 1/1998 | Tew et al. ...................... 430/5 |
| 5,976,741 A * | 11/1999 | Ziger et al. ..................... 430/30 |
| 6,078,381 A | 6/2000 | Suzuki ........................ 355/53 |
| 6,288,772 B1 * | 9/2001 | Shinozaki et al. ............. 355/53 |
| 6,341,007 B1 | 1/2002 | Nishi et al. .................... 355/53 |
| 6,400,441 B1 | 6/2002 | Nishi et al. .................... 355/53 |
| 6,545,274 B1 | 4/2003 | Morita ........................ 250/307 |

(Continued)

FOREIGN PATENT DOCUMENTS

CN        1329287 A        1/2002

(Continued)

OTHER PUBLICATIONS

European Search Report dated Nov. 29, 2005, issued in corresponding European patent appln. no. EP 04 00 1986, forwarded in a Communication dated Dec. 21, 2005.

(Continued)

*Primary Examiner*—Peter B. Kim
(74) *Attorney, Agent, or Firm*—Fitzpatrick, Cella, Harper & Scinto

(57) ABSTRACT

A projection exposure apparatus with a small size and low cost suitable for repeated pattern exposure. The apparatus includes an illumination system which irradiates light to a mask including plural columns of a mask pattern for repeated exposure to a member to form plural columns of an exposure pattern, a projection system which projects light from the mask onto the member, an exposure stage which moves the member, and a mask stage which moves the mask. The light irradiation and step driving of the exposure stage for moving the member by a movement amount equal to n times a pitch of the columns of the exposure pattern are alternately performed. The mask is moved by a movement amount equal to n times a pitch of the columns of the mask pattern with step driving of the exposure stage in early and later phases of the repeated exposure.

27 Claims, 22 Drawing Sheets

U.S. PATENT DOCUMENTS

| | | |
|---|---|---|
| 6,549,269 B1 | 4/2003 | Nishi et al. .................... 355/53 |
| 6,590,634 B1 | 7/2003 | Nishi et al. .................... 355/53 |
| 6,597,002 B1 * | 7/2003 | Kondo .................... 250/492.2 |
| 6,798,491 B1 | 9/2004 | Nishi et al. .................... 355/53 |
| 2004/0233407 A1 | 11/2004 | Nishi et al. .................... 355/53 |

FOREIGN PATENT DOCUMENTS

| | | |
|---|---|---|
| EP | 0 633 506 A1 | 1/1995 |
| JP | 4-23311 | 1/1992 |
| JP | 11-219900 | 8/1999 |
| JP | 2000-208410 | 7/2000 |

OTHER PUBLICATIONS

Holbrook, David S., et al. "Microlithography for Large Area Flat Panel Display Substrates," *Solid State Technology*, Pennwell Corporation, Tulsa, OK, vol. 35, no. 5, May 1, 1992, pp. 166-172.

Oct. 14, 2005 Chinese Official Action.

English translation of Chinese Office Action dated Oct. 14, 2005, issued in corresponding Chinese patent application number 200410003479.8.

* cited by examiner

PROJECTION EXPOSURE APPARATUS

BACKGROUND OF THE INVENTION

1. Field of the Invention

The present invention relates to a projection exposure technique for exposing a member under exposure to form a pattern of a mask (an original pattern plate) such as a photomask and a reticle thereon while the member is moved in a predetermined direction.

2. Description of the Related Art

FIG. 22 shows a projection exposure apparatus (a scan exposure apparatus) which exposes a large substrate for use in a liquid crystal display panel or the like to form a circuit pattern thereon.

In FIG. 22, reference numeral 81 shows a mask, 82 a mask scan stage, 83 a projection optical system, 84 a substrate scan stage, and 85 a substrate under exposure.

For transferring the circuit pattern to the substrate 85 in the scan exposure apparatus, exposure light is irradiated to the mask 81 which corresponds to a negative film in photography in directions indicated by small arrows in FIG. 22. The light transmitted through a mask pattern provided in the mask 81 forms an image of the mask pattern on the side of an image plane by the projection optical system 83. The substrate 85, which is disposed at the position where the mask pattern image is formed, is exposed to create the mask pattern image thereon.

In the projection exposure apparatus for exposing the large substrate for use in the liquid crystal display panel or the like to form the circuit pattern thereon, the provision of a large-diameter projection optical system capable of exposing a large substrate to form a whole desired mask pattern thereon at one time presents problems in the footprint, weight, stability, and cost of the apparatus. Thus, a certain type of projection optical system forms part of a mask pattern image in a slit-like shape, wherein a mask and a substrate are moved for scanning with respect to the projection system. This eliminates the need for the large-diameter projection optical system to allow the small apparatus to achieve exposure in a large region.

In this case, the mask 81 and the substrate 85, which are sized to take account of the size of the mask pattern image formed on the substrate 85 and the projection magnification of the projection optical system, are moved at a constant speed in directions indicated by large arrows in FIG. 22 with a controlled amount of exposure light to perform scan exposure.

A projection exposure apparatus which performs scan exposure has been proposed, for example, in Japanese Patent Application Laid-Open No. H11(1999)-219900.

In addition, Japanese Patent Application Laid-Open No. 2000-208410 has proposed a projection exposure apparatus which exposes a large substrate to form a cyclic pattern thereon through projection at a high density.

The following problems are found in the scan type exposure apparatus in which the mask stage and the substrate stage are moved when the large substrate is exposed to form the circuit pattern thereon.

(1) As the substrate is increased in size, the mask is also increased in size and the manufacturing cost of the mask is increased.

(2) A larger mask produces a warp thereof due to its own weight in the exposure apparatus to cause difficulty in providing a required exposure resolution.

(3) The entire exposure apparatus is increased in size and weight.

The problem (1) is hereinafter described in detail. In exposure of a substrate for use in a liquid crystal display panel or the like, circuit patterns for exposure include a continuous pattern having a continuous shape such as a signal line and a gate line and a discontinuous cyclic pattern consisting of mutually isolated repetitive pattern elements, for example, a gate, a source, a drain, a transparent dot electrode, and a storage capacitor electrode. It is thus difficult to employ a so-called stitching exposure method in terms of formation of the continuous pattern. As a result, the exposure apparatus generally performs exposure at a projection magnification of 1:1 to cause an increased size of the mask in association with a larger size of the substrate for a liquid crystal display panel. This presents a significant problem in time and cost involved in mask manufacture.

If the continuous pattern and the discontinuous cyclic pattern are processed in separate processes, the number of steps for exposure is increased to create disadvantages in process control and alignment, resulting in a factor which increases time and cost required for mask manufacture.

Next, the problem (2) is described in detail. The mask can be supported only at its periphery in the scan type exposure apparatus. A larger mask causes a warp thereof due to its own weight to use the margin of the focal depth of the projection system on the mask side. Thus, it is difficult to ensure a manufacture margin such as flatness on the side of the substrate, leading to difficulty in providing a required exposure resolution.

SUMMARY OF THE INVENTION

It is an object of the present invention to provide a projection exposure apparatus which is suitable for repetitive exposures for forming a pattern, has a small size, and requires a low cost, a projection exposure method, and a method of manufacturing an exposed member.

To achieve the aforementioned objects, according to a first aspect of the present invention, a projection exposure apparatus which uses a mask including plural columns of a mask pattern for repeated exposure to a member to form columns of an exposure pattern thereon, comprises an illumination system which irradiates light to the mask, a projection system which projects the light from the mask onto the member, an exposure stage which moves the member, a mask stage which moves the mask, and a controller which controls light irradiation from the illumination system to the mask driving of the exposure stage, and driving of the mask stage. The controller alternately performs the light irradiation and step driving of the exposure stage for moving the member by a movement equal to n times a pitch of the columns of the exposure pattern (where n is a natural number smaller than the number of the columns of the mask pattern). The controller also performs step driving of the mask stage for moving the mask by a movement amount equal to n times a pitch of the columns of the mask pattern in association with step driving of the exposure stage in an early phase and a later phase of the repeated exposure.

According to a second aspect of the present invention, a projection exposure apparatus which uses a mask including plural columns of a mask pattern for repeated exposure to a member to form columns of an exposure pattern thereon, comprises an illumination system which irradiates light to the mask, a projection system which projects the light from the illumination system onto the member, an exposure stage which moves the member, a light shielding member which shields light to prevent light projection onto the member from some of the plural columns of the mask pattern, a light shielding member stage which moves the light shielding member, and a controller which controls light irradiation from the illumination system to the mask, driving of the exposure stage, and driving of the light shielding member stage. The controller alternately performs the light irradiation and step driving of the exposure stage for moving the member by a movement amount equal to n times a pitch of the columns of the exposure pattern (where n is a natural number smaller than the number of the columns of the mask pattern). The controller also performs step driving of the light shielding member stage for moving the light shielding member by a movement amount corresponding to a pitch equal to n columns of the mask pattern in a light projection region on the member in association with step driving of the exposure stage in an early phase and a later phase of the repeated exposure.

According to a third aspect of the present invention, a method of projection exposure and a method of manufacturing an exposed member, comprise the steps of a first step of preparing a mask including plural columns of a mask pattern for repeated exposure to a member to form columns of an exposure pattern thereon, and a second step of alternately performing light projection from the mask onto the member through light irradiation to the mask and step movement of the member for moving the member by a movement amount equal to n times a pitch of the columns of the exposure pattern (where n is a natural number smaller than the number of the columns of the mask pattern) At the second step, the mask is moved in a step manner by a movement amount equal to n times a pitch of the columns of the mask pattern in association with the step movement of the member in an early phase and a later phase of the repeated exposure.

According to a fourth aspect of the present invention, a method of projection exposure and a method of manufacturing an exposed member, include the steps of a first step of preparing a mask including plural columns of a mask pattern for repeated exposure to a member to form columns of an exposure pattern thereon, and a second step of alternately performing light projection from the mask onto the member through light irradiation to the mask and step movement of the member for moving the member by a movement amount equal to n times a pitch of the columns of the exposure pattern (where n is a natural number smaller than the number of the columns of the mask pattern). At the second step, a light shielding region is formed to prevent light projection onto the member from some of the plural of columns of the mask pattern, and the light shielding region is moved in a step manner by a movement amount corresponding to a pitch equal to n columns of the mask pattern in a light projection region on the member in association with step driving of the member in an early phase and a later phase of the repeated exposure.

As the member, a semiconductor device is contemplated as a representative example.

These and other characteristics of the present invention will be apparent from the following description of specific embodiments with reference to the drawings.

DETAILED DESCRIPTION OF THE PREFERRED EMBODIMENTS

Embodiment 1

Figure 1:
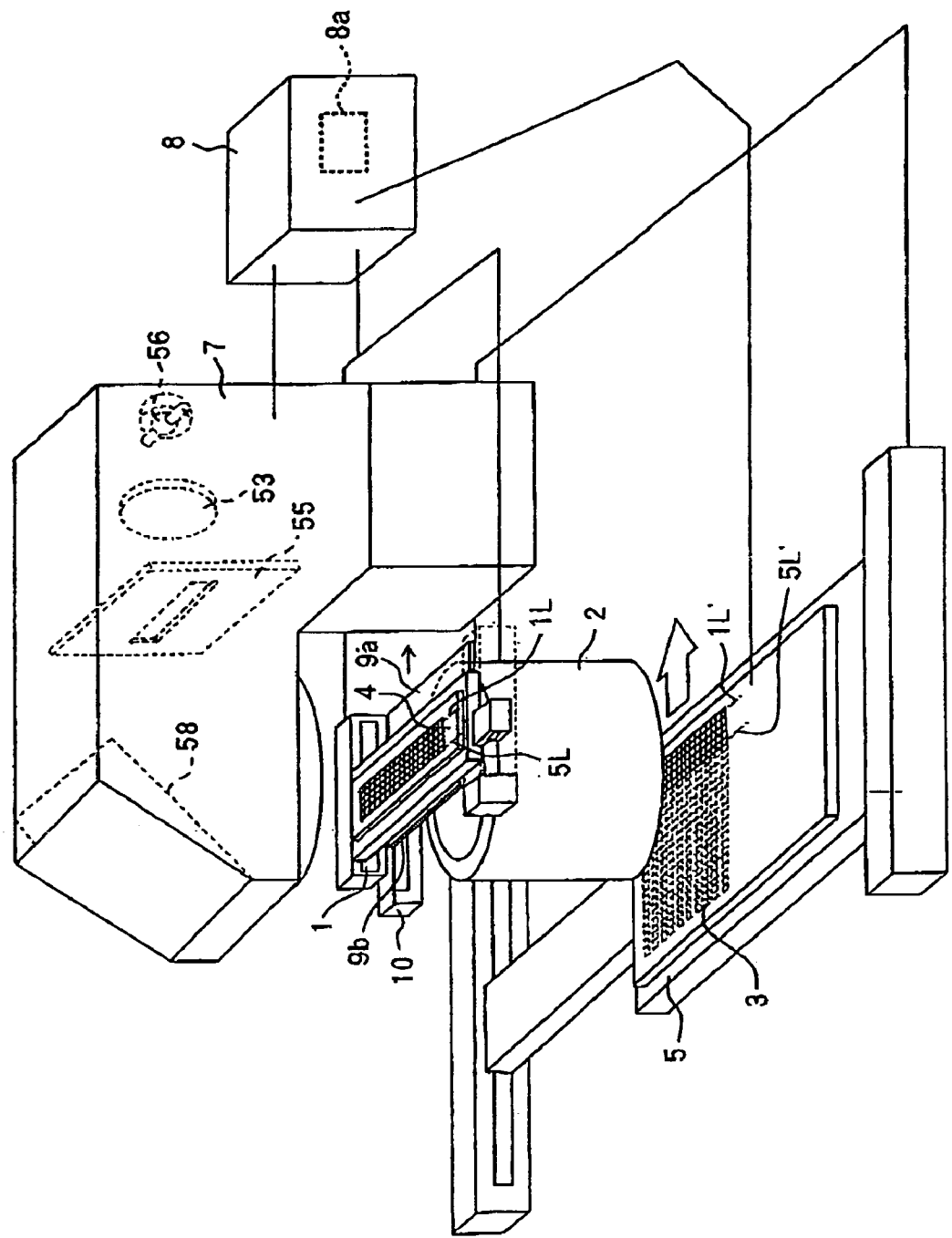
FIG. 1 is a schematic diagram showing main portions of a liquid crystal substrate exposure apparatus which is Embodiment 1 of the present invention.

FIG. 1 schematically shows the structure of a projection exposure apparatus (a liquid crystal substrate exposure apparatus: a scan type exposure apparatus of a lens projection type for forming a full-scale image of a mask) for a liquid crystal display panel substrate (a semiconductor device)

which is Embodiment 1 of the present invention. In the liquid crystal substrate exposure apparatus, reference numeral 4 shows an exposure mask. The shapes or the like of mask patterns are described later. Reference numeral 1 shows a mask stage on which the mask 4 is mounted. The mask stage 1 is driven in a direction (a lateral direction in FIG. 1) orthogonal to an irradiation light axis of illumination light from an illumination system 7, later described, and to a projection optical axis of a projection lens 2, later described.

The projection lens 2 projects light (exposure light) transmitted through the mask pattern of the mask 4, of illumination light irradiated to the mask 4, onto a substrate 3 under exposure which is a glass substrate for a liquid crystal display panel. A photoresist, which is a photosensitive material, is applied to a surface of the substrate 3.

Reference numeral 5 shows a substrate stage on which the substrate 3 is mounted. The substrate stage 5 is driven in a step manner in directions (the lateral direction and a depth direction in FIG. 1) orthogonal to the projection optical axis of the projection lens 2.

The illumination system 7 which irradiates illumination light to the mask 4 is formed of a light source 56, a condenser lens 53 which diverges and collimates the luminous flux from the light source 56, a limiting slit plate 55 provided at a conjugate position to the mask 4 in order to cut part of the collimated luminous flux from the condenser lens 53 which is not used as irradiation light to the mask 4 to form an exposure irradiation region with a predetermined area, and a mirror 58 which reflects the luminous flux from the limiting slit plate 55 and irradiates the reflected illumination luminous flux in a slit-like shape to the mask 4.

In the structure described above, the illumination system employs a so-called Kohler illumination system.

Reference numeral 8 shows a control box which contains a control circuit 8a. The control circuit 8a includes a light source control section which controls operation of a light source of the illumination system, a sensing section which detects positions of the respective stages 1 and 5, and a stage control section which controls driving of the respective stages 1 and 5 by using a detection signal from the sensing section. The control sections control the light source 56, the mask stage 1, and the substrate stage 5 in accordance with a predetermined computer program.

Of illumination light irradiated to the mask 4, exposure light transmitted through the mask pattern is irradiated to the substrate 3 on the substrate stage 5 via the projection lens 2. The mask 4 is mounted on the mask stage 1 such that the mask pattern surface is located at the position of an object-side focal point of the projection lens 2, and the substrate 3 is mounted on the substrate stage 5 such that a photosensitive surface of the substrate 3 is located at the position of an image-side focal point of the projection lens 2. Consequently, a full-scale image of the mask pattern is formed on the photosensitive surface of the substrate 3, and the substrate 3 is exposed to form the mask pattern image on the photosensitive surface thereof.

Figure 2:
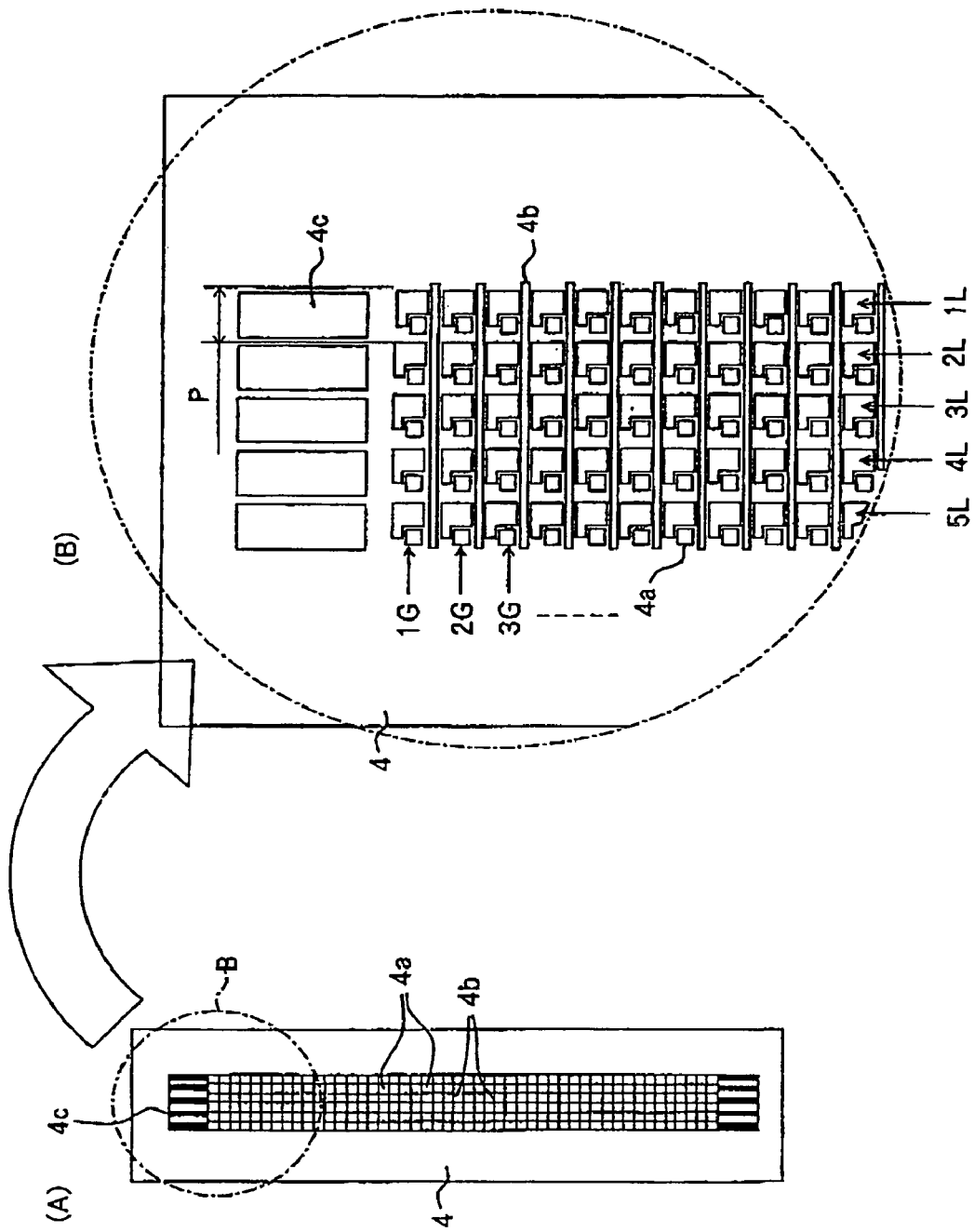
FIGS. 2(A) and 2(B) are explanatory views of an exposure mask for use in the liquid crystal substrate exposure apparatus of Embodiment 1.

FIG. 2(A) shows the mask 4 for use in the liquid crystal substrate exposure apparatus in FIG. 1. FIG. 2(B) is an enlarged view of a portion B in FIG. 2(A).

In FIGS. 2(A) and 2(B), reference numeral 4a shows a pixel mask pattern (a first mask pattern) for exposing the substrate 3 to form a pixel pattern which is a discontinuous cyclic (repetitive) pattern thereon.

The substrate 3 is exposed to form the pixel pattern thereon consisting of transparent electrodes which are arranged in a lateral direction (the driving direction of the substrate stage 5 indicated by the outline arrow in FIG. 1) and a longitudinal direction with a predetermined pitch to form a plurality of pixel pattern rows extending in the lateral direction and a plurality of pixel pattern columns extending in the longitudinal direction, that is, a matrix.

The mask 4 of Embodiment 1 has the pixel mask pattern 4a formed thereon such that individual pattern elements thereof are arranged in columns in a longitudinal direction of the mask 4 (an up-down direction in FIGS. 2(A) and 2(B): a direction corresponding to the longitudinal direction of the substrate 3). Five pixel mask pattern columns 1L to 5L, the number of which is much smaller than the total number of pixel pattern columns exposed on the substrate 3, are arranged in a direction orthogonal to the longitudinal direction of the mask 4 (a left-right direction in FIGS. 2(A) and 2(B): the driving direction of the, mask stage 1 indicated by the outline arrow in FIG. 1). The images of the five pixel mask pattern columns 1L to 5L are repeatedly exposed on the substrate 3 through a plurality of exposures to allow all the pixel pattern columns to be exposed on the substrate 3.

The pixel mask pattern 4a has a plurality of rows extending in the direction orthogonal to the longitudinal direction of the mask 4. The mask 4 of Embodiment 1 has pixel mask pattern rows 1G, 2G, 3G, . . . , formed thereon, the number of which is the same as the total number of pixel pattern rows to be formed on the substrate 3.

Since a full-scale image of the mask pattern is projected onto the substrate 3 in the exposure apparatus of Embodiment 1, the pixel mask pattern columns have a pitch P identical to a pitch (an arrangement pitch) of the pixel pattern columns to be exposed on the substrate 3. In the following, the pitch of the pixel pattern columns exposed on the substrate 3 is also represented by P.

Reference numeral 4b shows a gate line mask pattern (a second mask pattern) for exposing the substrate 3 to form a gate line pattern, which is a continuous pattern, between adjacent pixel pattern rows. The gate line mask pattern 4b is formed as a continuous linear pattern between adjacent pixel mask pattern rows.

Reference numeral 4c shows a driver mask pattern for exposing the substrate 3 to form a driver pattern, which is a discontinuous cyclic pattern, with a pitch identical to the pitch of the pixel pattern columns on both sides of the pixel pattern columns in the vertical (longitudinal) direction. The driver mask pattern 4c is formed on each side of the pixel mask pattern columns 1L to 5L in the mask 4.

The periphery of the mask 4 other than the region where the aforementioned respective mask patterns are formed is a blank region at which the mask 4 is supported on the mask stage 1. Illumination luminous flux in a slit-like shape from the illumination system 7 is irradiated to the rectangular region which includes all the pixel mask pattern 4a, the gate line mask pattern 4b, and the driver mask pattern 4c on the mask 4.

Embodiment 1 is particularly useful when the mask 4, which has the pixel mask pattern 4a (and the driver mask pattern 4c) for repeatedly exposing the discontinuous cyclic pattern and the gate line mask pattern 4b for exposing the continuous pattern is used as described above. Thus, the description is continued with such a case taken as an example. However, Embodiment 1 is also useful when a mask which has no mask pattern for exposing a continuous pattern is used.

Next, a description is made of an exposure operation of the liquid crystal substrate exposure apparatus of Embodiment 1 when the aforementioned mask 4 is used. In the exposure operation in Embodiment 1, the substrate 3 is repeatedly exposed to form the respective patterns thereon by alternately performing projection of exposure light onto the substrate 3 from the respective mask patterns 4a to 4c by irradiation of illumination light from the illumination system 7 to the mask 4 and step movement of the substrate 3 resulting from step driving of the substrate stage 5 while the mask 4 is fixed.

It should be noted that the substrate stage 5 is not driven to stop the substrate 3 during the projection of the exposure light onto the substrate 3.

Such an exposure method eliminates the need to drive the mask stage 1 and the substrate stage 5 in synchronization. The pattern image formed through exposure on the substrate 3 is stabilized to result in improvement in yields of the substrate.

A step movement amount and an exposure time in one exposure (a stop time of the substrate 3 and the substrate stage 5) are determined in consideration of the relationship between sensitivity of a resist applied to the substrate 3 and illuminance on an image plane through the projection lens 2 such that a required amount of exposure light is provided for the substrate 3.

In Embodiment 1, the step movement amount of the substrate 3 (the step driving amount of the substrate stage 5) is n times the pitch P of the pixel pattern columns exposed on the substrate 3, where n is a natural number smaller than the number of the pixel mask pattern columns (five columns).

When the number of pixel pattern columns exposed on the substrate through one projection operation of exposure light, that is, the number of pixel mask pattern columns of the mask is equal to "a" (a plural number), and the number of projection operations of exposure light is set to "b" (a plural number) to provide an amount of exposure light required in exposure of the substrate to form the pixel pattern columns thereon, the step movement amount may be set to "aP/b", where "a/b" corresponds to n described above.

For example, when the mask 4 has the five columns (a=5) and setting is made such that five projection operations of exposure light are performed to provide a required amount of exposure light (b=5), 5×P/5=P (n=1<a=5), the step movement amount of the substrate 3 is equal to the pitch P of the pixel pattern columns exposed on the substrate 3. Alternatively, if the mask has six pixel pattern columns (a=6) and setting is made such that three projection operations of exposure light are performed to provide a required amount of exposure light (b=3), 6×P/3=2×P (n=2<a=6), the step movement amount of the substrate 3 is equal to two pitches P of the pixel pattern columns formed on the substrate 3.

With this setting, each time the substrate 3 is moved in a step manner in the image plane region of the projection lens 2, the substrate 3 is exposed to newly form n pixel pattern columns and again form the previously formed pixel pattern columns, the number of which is obtained by subtracting n from a, where a represents the total number of pixel pattern columns exposed in the previous exposure.

When the substrate 3 is moved in a step manner and exposure is performed at each step position in this manner, the pixels are formed on the substrate 3 through b projection operations. Specifically, when an amount of exposure light required in proper exposure for the pixels is defined as A (mW), an amount of exposure light in one shot may be A/b (mW). Thus, a proper amount of exposure light can be provided finally even when the light source 56 emits a small amount of light.

The substrate 3 is repeatedly exposed while the substrate 3 is moved in a step manner by an amount of n×P in the image plane region of the projection lens 2. This achieves exposure with a required amount of exposure light. In addition, the substrate 3 can be exposed to completely form the patterns over the entire exposure region thereof through a single exposure process (a series of exposure steps) in which the projection of the exposure light and the step movement of the substrate 3 are alternately performed while continuity of the gate line pattern, which is the continuous pattern, is ensured.

Figure 3:
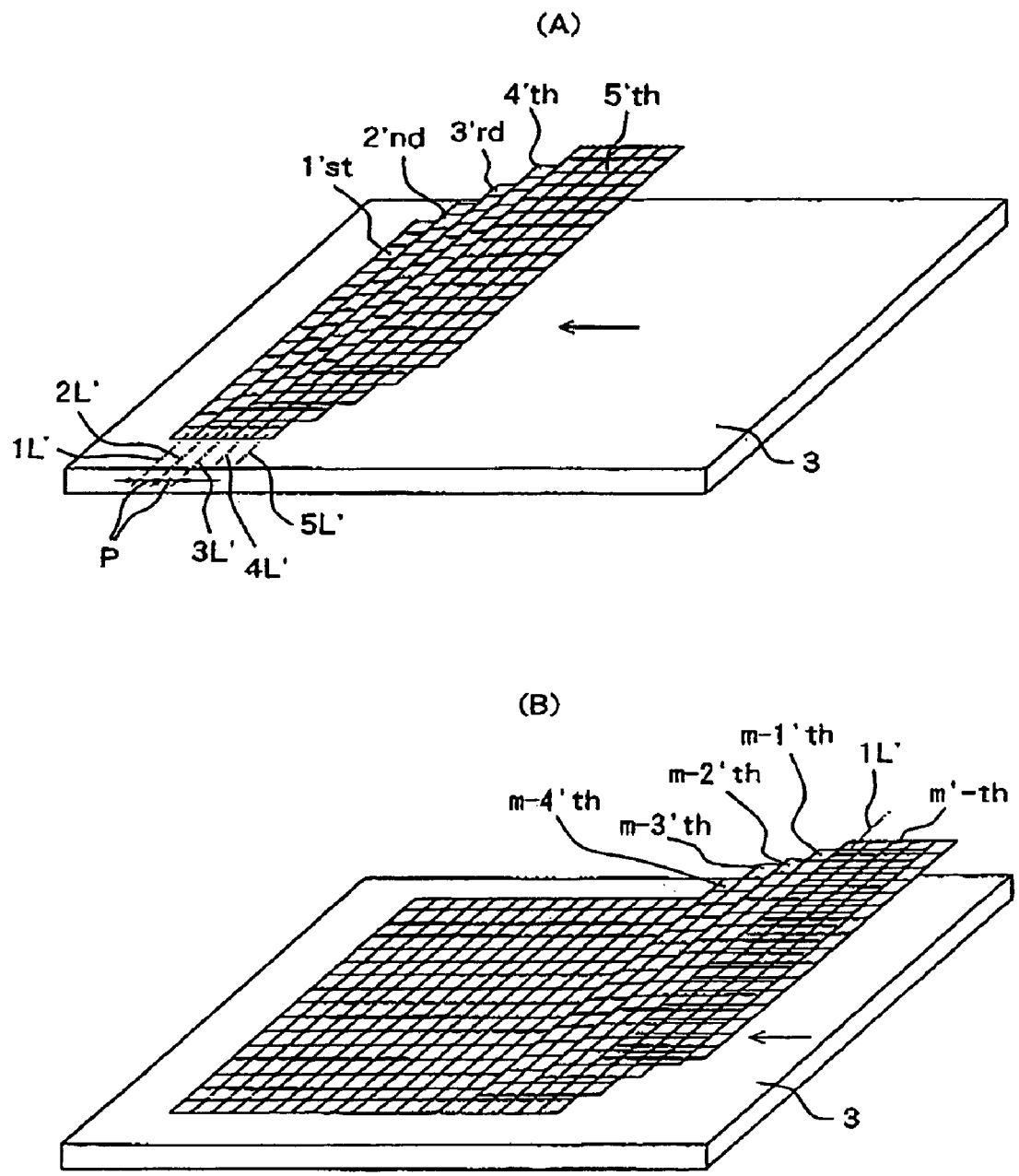
FIGS. 3(A) and 3(B) schematically show exposure of a substrate to form a pattern thereon with the liquid crystal substrate exposure apparatus of Embodiment 1.

The relationship is described in detail with reference to FIGS. 3(A) and 3(B) which show a change in the positional relationship between the substrate 3 and the mask 4 in the exposure process. FIGS. 3(A) and 3(B) show the case where the pixel mask pattern 4a of the mask 4 has five columns and the step movement amount of the substrate 3 is equal to the pitch of the pixel pattern columns (n=1). In FIGS. 3(A) and 3(B), the substrate 3 is moved in a step manner in directions indicated by arrows (to the left).

FIG. 3(A) shows the substrate 3 in an early phase in a series of exposure steps. First, a first shot is performed as the first projection (shot) of exposure light. This results in exposure of the substrate 3 to expose five pixel pattern columns 1L' to 5L' thereon. An amount of exposure light in this shot corresponds to A/b (mW) described above and does not reach the required amount of exposure light.

Next, the substrate 3 is moved in a step manner to the left in FIG. 3(A) for one pitch of the pixel pattern columns and stopped, and then a second shot is performed. In the second shot, superposed exposure is performed for the second to fifth pixel pattern columns 2L to 5L from the left of the five pixel pattern columns exposed in the previous first shot. In the second shot, a new pixel pattern column is also exposed on the right of the rightmost pixel pattern column 5L exposed in the first shot.

Next, the substrate 3 is moved in a step manner for one pitch of the pixel pattern columns and stopped, and then a third shot is performed. This achieves third exposures for the third to fifth pixel pattern columns 3L' to 5L' from the left of the five pixel pattern columns exposed in the first shot. In the third shot, a new pixel pattern column is also exposed on the right of the pixel pattern column newly exposed in the second shot.

Thereafter, each time the substrate 3 is moved in a step manner for one pitch of the pixel pattern columns, a subsequent shot is performed (as a fourth, a fifth, a sixth shot or the like). As a result, an amount of exposure light in the fifth column or later from the leftmost pixel pattern column 1L exposed in the first shot reaches the proper amount of exposure light which corresponds to the amount of exposure light for five shots, that is, A (mW).

Five exposures (shots) are not performed in the first to fourth pixel pattern columns 1L' to 4L' from the leftmost column exposed in the first shot in the early phase of the exposure process. If certain measures are not taken, the proper amount of exposure light is not provided for such pixel pattern columns.

Figure 4:
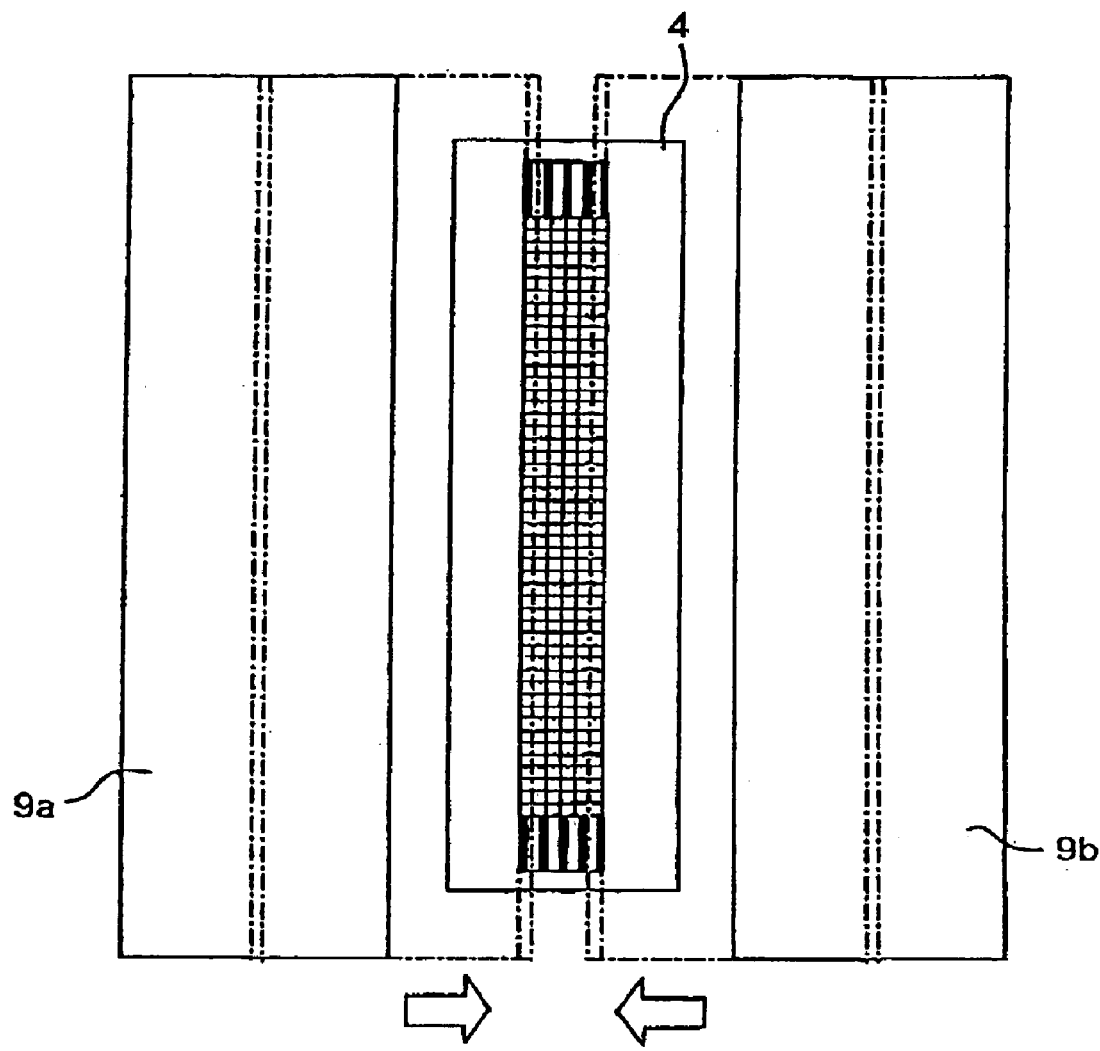
FIG. 4 is a schematic plan view showing a light shielding blade for use in the liquid crystal substrate exposure apparatus of Embodiment 1.

To address this, in Embodiment 1, light shielding blades 9a and 9b are provided between the mask 1 and the projection lens 2 as shown in FIG. 1 and FIG. 4 for shielding part of the exposure light from the mask 4 (the pixel mask pattern 4a) to limit the exposure region.

The light shielding blades 9a and 9b are disposed on the left and right of the mask 4, respectively. The positions of the light shielding blades 9a and 9b are controlled separately from each other through driving of a blade stage 10 shown in FIG. 1 such that they are movable back and forth to four light shielding positions at which exposure light through one to four pixel mask pattern columns of the mask 4 shown in FIG. 2 counted from the light shielding blade, of the five pixel mask pattern columns 1L to 5L, can be prevented from being incident on the projection lens 2 (that is, from being projected onto the substrate 3), and to a non-shielding position at which exposure light through all the pixel mask pattern columns 1L to 5L can be incident on the projection lens 2. The driving of the blade stage 10 between the two positions is controlled, by the stage control circuit 8a provided for the control circuit 8a in the control box 8.

Figure 5:
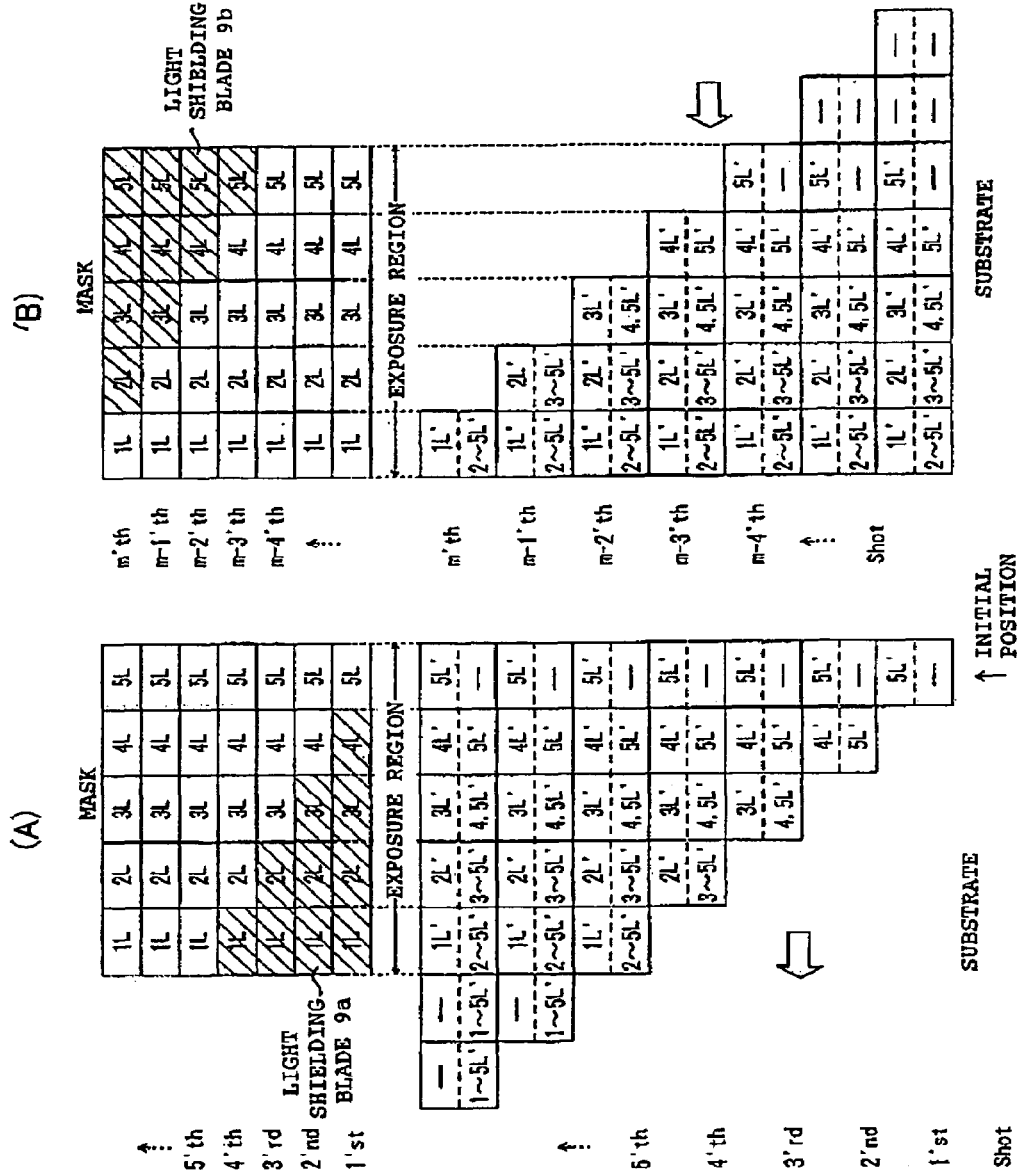
FIGS. 5(A) and (B) are schematic diagrams for describing exposure of the substrate (in an early phase and a later phase) to expose the pattern thereon with the liquid crystal substrate exposure apparatus of Embodiment 1.

FIG. 5(A) schematically shows the relationship between the exposure region limited by the light shielding blade 9a and the pixel pattern columns actually exposed on the substrate 3 in the early phase of the exposure process. In FIG. 5(A), an upper section shows the pixel mask pattern on the fixed mask 4, while a lower section shows the pixel pattern exposed on the substrate 3 which is moved in a step manner to the left in FIG. 5(A).

In the upper section, hatched blocks show a region in which the exposure light from the mask 4 toward the projection lens 2 is shielded by the light shielding blade 9a. In the lower section, each block is divided by a dotted line into an upper subblock and a lower subblock, in which the upper subblock shows a pixel pattern column exposed in the current shot, while the lower subblock shows one or plural pixel pattern columns exposed in the previous shot.

Before the first shot is performed, the light shielding blade 9a is moved to a position (a light shielding initial position) where it shields exposure light from the pixel mask pattern columns 1L to 4L and causes exposure light from the pixel mask pattern column 5L to be incident on the projection lens 2. Consequently, in the first shot, the pixel pattern columns 1L to 4L corresponding to the pixel mask pattern columns 1L to 4L are not exposed, and only the pixel pattern column 5L corresponding to the pixel mask pattern column 5L is exposed.

Thereafter, each time the substrate 3 is moved in a step manner, the light shielding blade 9a is moved to a position where the light shielding blade 9a shields exposure light from the pixel mask pattern columns 1L to 3L and allows exposure only for the pixel pattern columns 4L and 5L (in the second shot), to a position where it shields exposure light from the pixel mask pattern columns 1L and 2L and allows exposure only for the pixel pattern columns 3L to 5L (in the third shot), and to a position where it shields exposure light from the pixel mask pattern column 1L and allows exposure only for the pixel pattern columns 2L to 5L (in the fourth shot), sequentially.

In other words, the light shielding blade 9a is moved in a step manner in a direction identical to the step movement direction of the substrate 3 (see the solid line arrow in FIG. 1) in synchronization with the step movement thereof by the movement amount for eliminating the shielding of the exposure light from one pixel mask pattern column (that is, the movement amount for allowing the light projection region on the substrate 3 to change by one (n) pixel mask pattern column, further in other words, the movement amount corresponding to a pitch equal to one (n) column of the pixel mask pattern in the light projection region on the substrate 3). In the fifth shot or later (in the step movement of the substrate 3 after the fourth shot or later), the light shielding blade 9 is retracted to the non-shield position until a later stage of the exposure process, later described. Thus, in the fifth shot or later, the pixel pattern columns 1L to 5L corresponding to all the pixel mask pattern columns 1L to 5L are exposed.

With this operation, it is possible to actually start exposure of the substrate 3 at the position of the pixel pattern column 5L' corresponding to the pixel mask pattern column 5L exposed in the first shot. Before the first shot, the initial position of the substrate 3 is set such that exposure light from the pixel mask pattern column 5L is projected onto the leftmost exposure start position in the pixel pattern exposure region in FIG. 3(A) and FIG. 5(A) (the position where the pixel pattern column 1L is located in FIG. 3(A)), thereby allowing exposure of the pixel pattern columns with the proper amount of exposure light from the exposure start position in the pixel pattern exposure region.

FIG. 3(B) shows the substrate 3 in the later stage of the series of exposure steps. In the later stage in which five exposures are performed including the last m'th shot, the substrate 3 is similarly exposed to form pixel pattern columns thereon. However, a proper amount of exposure light can be provided until the exposure for the pixel pattern column 1L'corresponding to the pixel mask pattern column 1L of the pixel pattern columns exposed in the m'th shot.

For this reason, in the later stage, the other light shielding blade 9b is moved in a step manner in the same direction as the step movement direction of the substrate 3 in synchronization therewith by a movement amount for shielding exposure light from one pixel mask pattern column.

FIG. 5(B) schematically shows the relationship between the exposure region limited by the light shielding blade 9b and the pixel pattern actually exposed on the substrate 3 in the later stage of the exposure process. In FIG. 5(B), an upper section shows the pixel mask pattern on the fixed mask 4, while a lower section shows the pixel pattern exposed on the substrate 3 which is moved in a step manner to the left, similarly to FIG. 5(A).

In the upper section, hatched blocks show regions in which the exposure light from the mask 4 toward the projection lens 2 is shielded by the light shielding blade 9b. In the lower section, each block is divided by a dotted line into an upper subblock and a lower subblock, in which the upper subblock shows a pixel pattern column exposed in the current shot, while the lower subblock shows one or plural pixel pattern columns exposed in the previous shot.

In the later stage of the exposure process, the light shielding blade 9b is retracted to the non-shielding position until an m-fourth shot is performed. With the step movement of the substrate 3 after the m-fourth shot, the light shielding blade 9b is moved in a step manner to a position where it shields exposure light from the pixel mask pattern column 5L and causes only exposure light from the pixel mask pattern columns 1L to 4L to be incident on the projection lens 2. Thus, in the next m-third shot, only the pixel pattern columns 1L to 4L corresponding to the pixel mask pattern columns 1L to 4L are exposed.

Thereafter, each time the substrate 3 is moved in a step manner, the light shielding blade 9b is moved to a position where the light shielding blade 9b shields exposure light from the pixel mask pattern columns 4L and 5L and allows exposure only for the pixel pattern columns 1L to 3L (in an m-second shot), to a position where it shields exposure light from the pixel mask pattern columns 3L to 5L and allows exposure only for the pixel pattern columns 1L and 2L (in an m-first shot), and to a position where it shields exposure light from the pixel mask pattern columns 2L to 5L and allows exposure only for the pixel pattern column 1L (in the m-th shot), sequentially.

It is thus possible to complete actual exposure of the substrate 3 with the proper amount of light with the pixel pattern column 1L'corresponding to the pixel mask pattern column 1L formed in the m'th shot as the last columns.

In this manner, in the early phase and later phase of the series of repetitive exposure steps, the light shielding blades 9a and 9b are used to limit the exposure region. This allows exposure for the pixel pattern with the proper amount of exposure light over the entire pixel pattern exposure region on the substrate 3.

Embodiment 1 takes an example in which the light shielding blades 9a and 9b for shielding the exposure light from the mask 4 are used to limit the exposure region. Alternatively, it is possible that the limiting slit plate 55, which is provided in the illumination optical system 7 and defines the irradiation region of illumination light to the mask 4, has functions equal to those of the light shielding blades. In this case, as compared with the case where the light shielding blades 9a and 9b are used, the structure of the apparatus can be simplified, and the physical space required between the mask 4 and the light shielding blades 9a, 9b is not needed, so that an advantage is provided in terms of image formation.

The light shielding blades 9a and 9b are disposed at the light shielding position for limiting the exposure region, that is, at the position where they receive part of the exposure light from the mask 4. Thus, if a detection element is provided on the light shielding blade 9a and 9b to measure a light amount, the distribution of the exposure light amount in the substrate moving direction can be measured to obtain data for checking the status of the light source 56 or calculating the proper exposure time.

While only the exposure for the pixel pattern has been described, the driver pattern is also exposed with a proper amount of exposure light. In addition, the gate line pattern is also exposed with a proper amount of exposure light as a continuous pattern resulting from repeated exposures shifted by the length of one pitch of the pixel pattern columns in each shot.

As described above, the substrate 3 is exposed to form all the pixel pattern (the discontinuous cyclic pattern), the driver pattern (the discontinuous cyclic pattern), and the gate line pattern (the continuous pattern) thereon with the proper amount of exposure light only through one series of exposure steps by using the mask 4.

Figure 6:
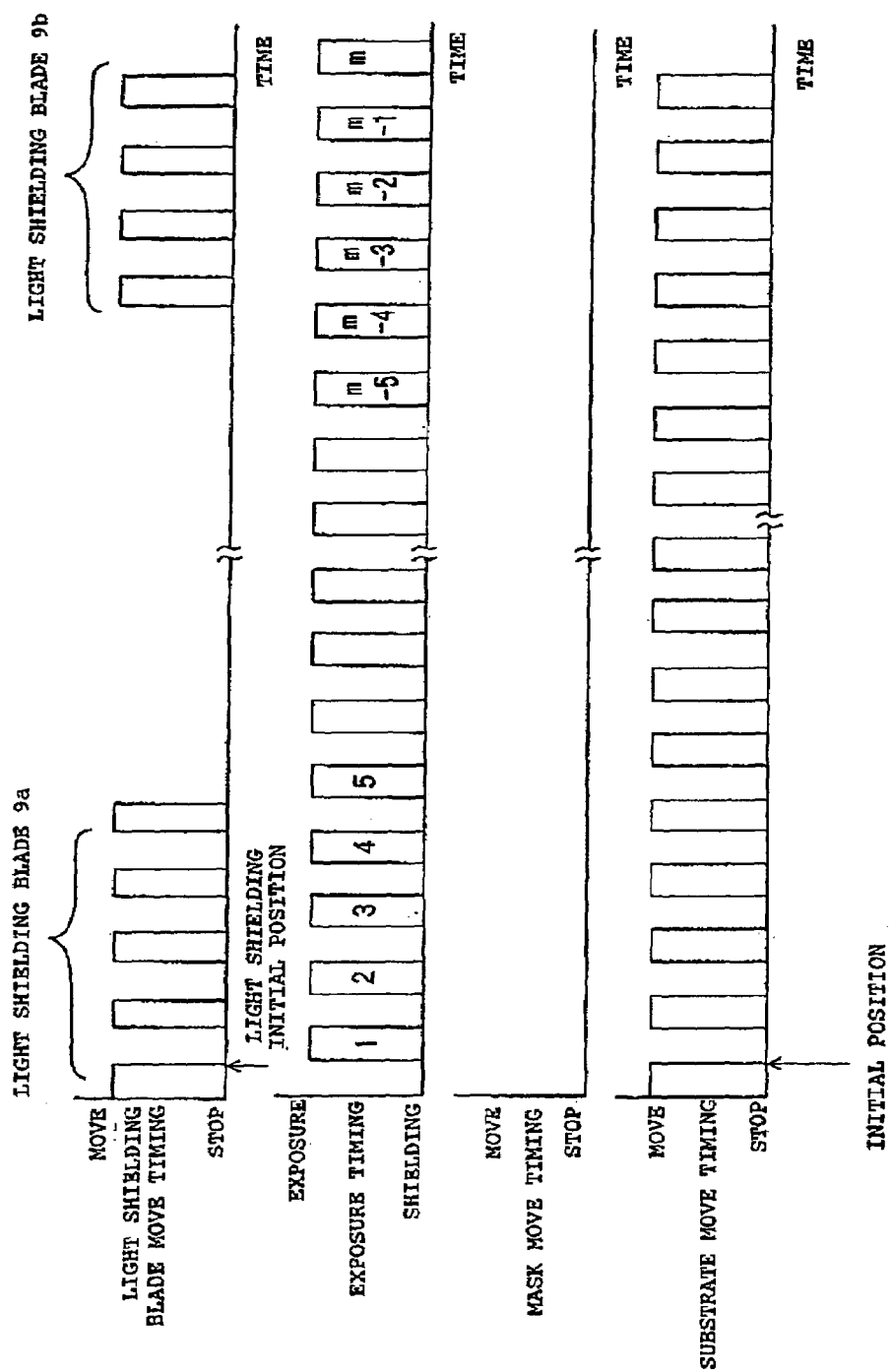
FIG. 6 shows operation timings in the liquid crystal substrate exposure apparatus of Embodiment 1.

FIG. 6 shows timings of the movement of the light shielding blades 9a and 9b (the driving of the blade stage 10), the projection of the exposure light (the light emission of the light source 56), and the movement of the substrate 3 (the driving of the substrate stage 5) in the abovedescribed one series of exposure steps. The mask 4 is fixed at the position where the respective mask patterns are included in the irradiation region of the illumination light.

As shown in FIG. 6, first, the substrate 3 is moved to the aforementioned initial position, and the light shielding blade 9a is moved to the initial position where it shields exposure light from the pixel mask pattern columns 1L to 4L. Then, a shot (exposure) corresponding to projection of exposure light and step movement of the substrate 3 are alternately performed.

In the early and later phases of the exposure process, the light shielding blades 9a and 9b are moved in a step manner together with the substrate 3 as shown in FIGS. 5(A) and 5(B) to provide the proper amount of exposure light. At the time when the substrate 3 and the light shielding blades 9a, 9b are stopped, the next shot (exposure) is performed.

Figure 7:
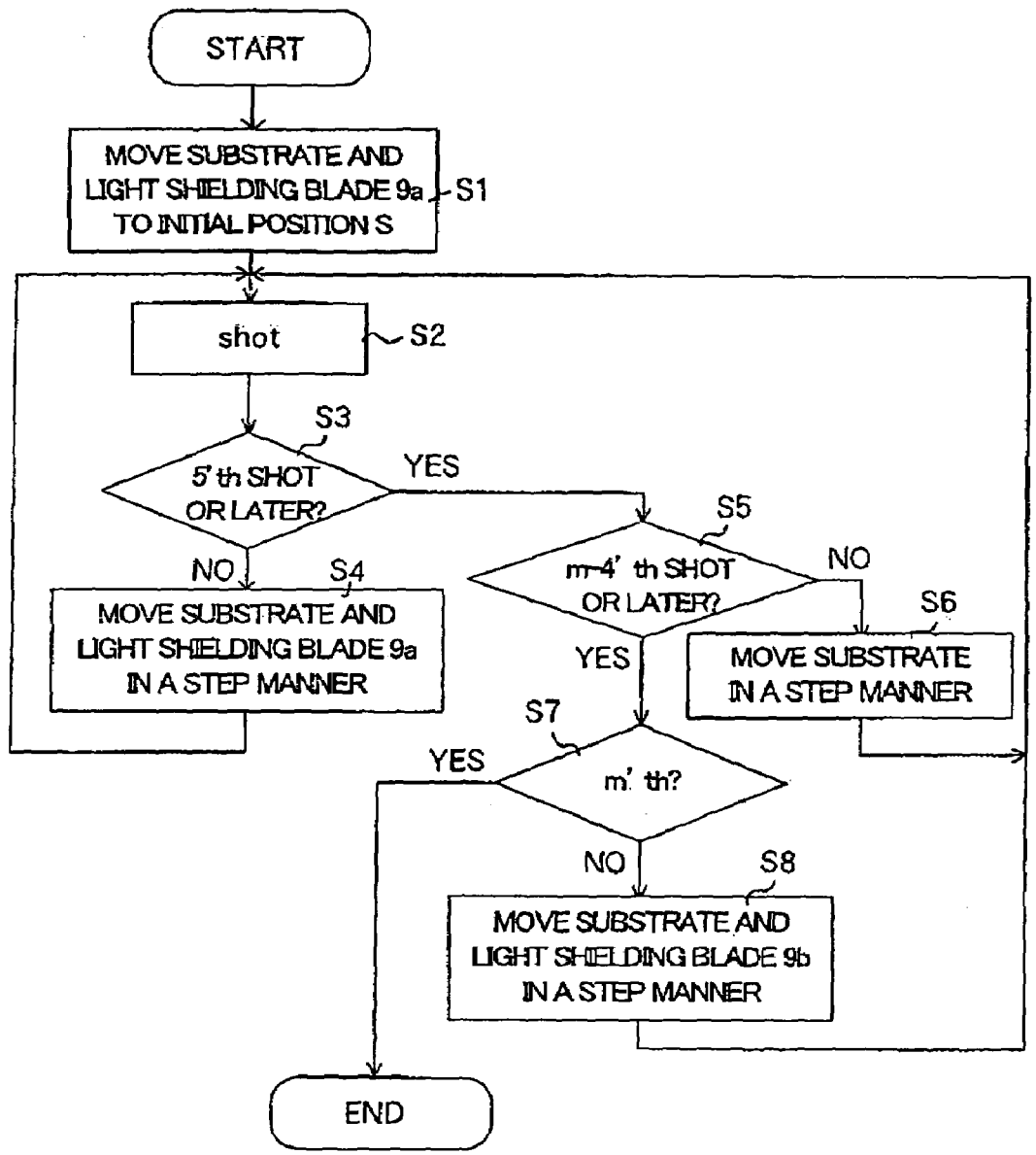
FIG. 7 is a flow chart for showing operation of the liquid crystal substrate exposure apparatus of Embodiment 1.

FIG. 7 is a flow chart of operation of the control circuit 8a in the series of exposure steps. A description is hereinafter made of the operation flow chart in conjunction with FIG. 1.

At step S1, the control circuit 8a drives the substrate stage 5 and the blade stage 10 to move the substrate 3 and the light shielding blade 9a to the aforementioned initial positions, respectively. This starts the exposure process.

Next, at step S2, a shot (exposure) is performed. At this point, the control circuit 8a increments the shot count by one.

Then, at step S3, the control circuit 8a determines whether or not the shot at step S2 is the fifth shot or later based on the shot count. If the shot does not reach the fifth shot, the flow proceeds to step S4, and the control circuit 8a moves the substrate 3 and the light shielding blade 9a in a step manner as described in FIG. 5(A). Then, the flow returns to step S2 to again perform a shot (exposure).

On the other hand, if it is determined at step S3 that the shot at step S2 is the fifth shot or later, the flow proceeds to step S5, and the control circuit 8a determines whether or not the shot at step S2 is the m-fourth shot or later. It should be noted that m represents the total number of exposures (the number of shots) required for exposing the substrate 3 to form all the circuit patterns thereon with the mask 4, and is previously set through input by a user or the like.

If it is determined at step S5 that the shot does not reach the m-fourth shot, the flow proceeds to step S6 and the control circuit 8a moves only the substrate 3 in a step manner. Then, the flow returns to step S2 to again perform a shot (exposure).

If it is determined at step S5 that the shot at step S2 is the m-fourth shot or later, the flow proceeds to step S7 and the control circuit 8a determines whether or not the shot at step S2 is the last shot (the m-th shot). If it is determined that the shot is not the last shot (the m-th shot), the flow proceeds to step S8, and the control circuit 8a moves the substrate 3 and the light shielding blade 9b in a step manner as described in FIG. 5(B).

While the flow proceeds from step S3 to step S4, the light shielding blade 9a limits the exposure region in a step manner as shown in FIG. 5(A). In addition, while the flow proceeds from step S3 to step S8, the light shielding blade 9b limits the exposure region in a step manner as shown in FIG. 5(B).

If it is determined at step S7 that the shot at step S2 is the last shot (m'th shot), the flow (that is, the exposure process) is terminated.

According to Embodiment 1, the step movement of the substrate 3 can be combined with the superposed exposure for the pattern to realize proper exposure of the large substrate 3 while the small mask 4 is used. In addition, the aforementioned step movement can be combined with the superposed exposure for the pattern to relax the requirements of higher power of the light source 56 of the illumination system 7, improved transmittance (reflectivity) of the projection lens 2, and higher sensitivity of the photoresist applied to the substrate 3, so that so-called flash-on-the-fly can be achieved to improve throughput. In this case, smoothness and stability of the driving are needed in the substrate stage 5.

Figure 8:
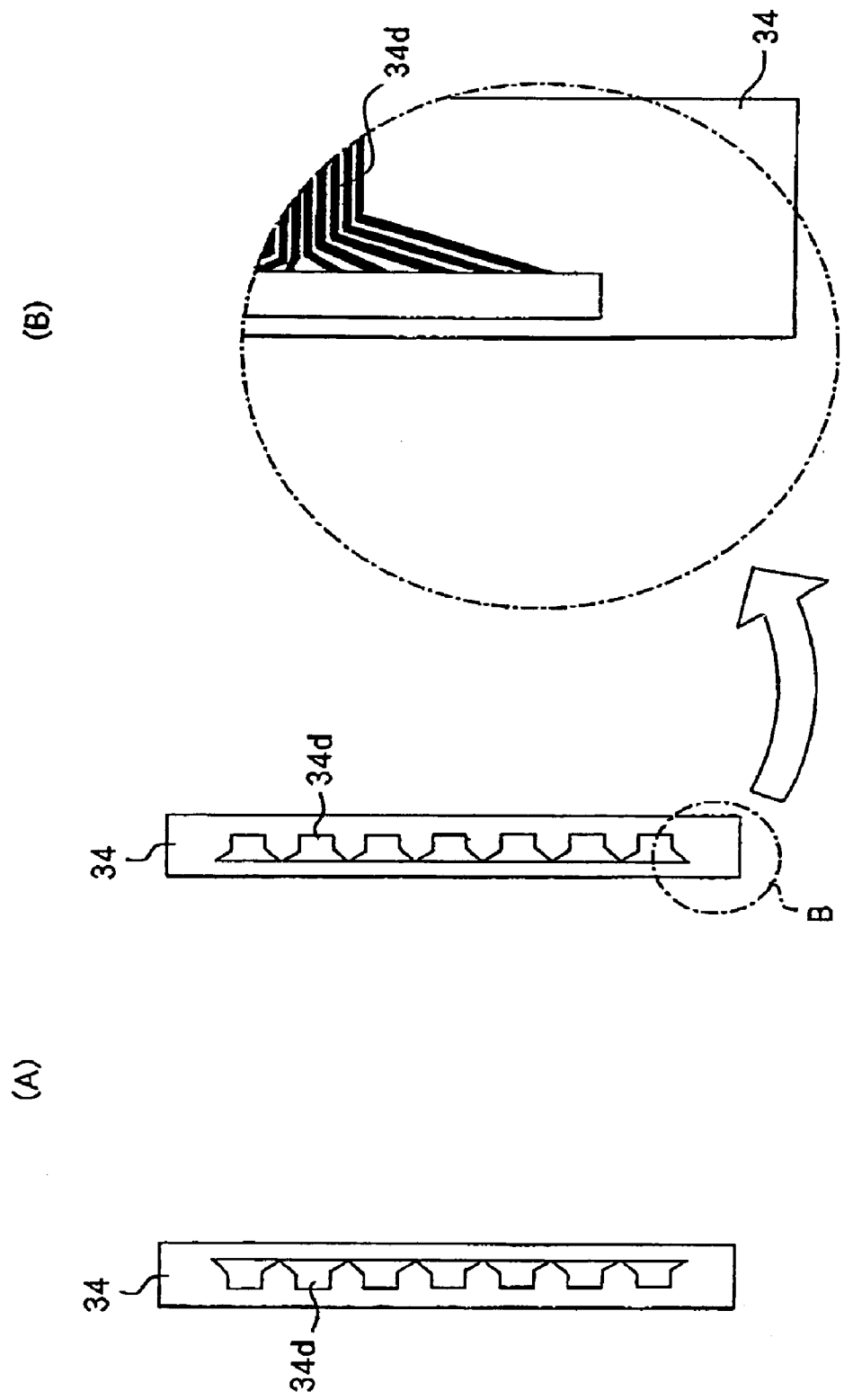
FIGS. 8(A) and 8(B) are explanatory views of another exposure mask for use in Embodiment 1.

After the aforementioned exposure steps, two masks 34 each having only a tab mask pattern 34d shown in FIG. 8(A) are used to expose the substrate 3 to form the tab pattern on both sides in the step movement direction of the substrate 3 in the periphery of the pixel pattern exposure region on the substrate 3. FIG. 8(B) is an enlarged view of a portion B in FIG. 8(A). In this case, as in exposure for a tab pattern in Embodiment 2, later described, the mask 34 (the mask stage) may be moved in a step manner to perform superposed exposure to form the tab pattern in association with (in synchronization with) the step movement of the substrate 3.

In addition, the substrate 3 is exposed while it is moved in a step manner to form a (longitudinal) gate line pattern along each pixel pattern column by using another mask, (not shown) (for example, a mask having five gate line mask pattern columns formed thereon), as in the exposure with the mask 4.

Figure 9:
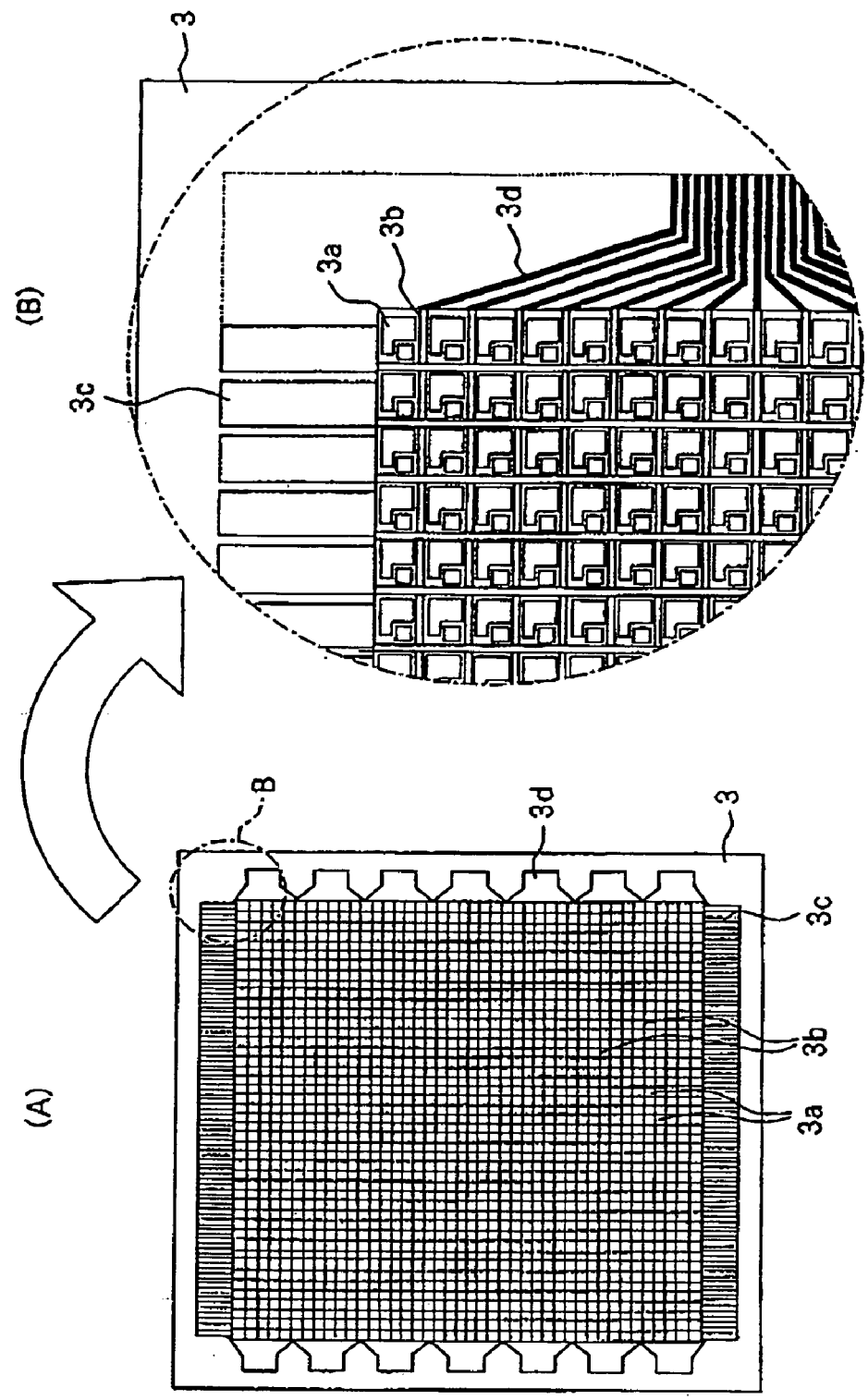
FIGS. 9(A) and 9(B) are explanatory views of the substrate exposed by the liquid crystal substrate exposure apparatus of Embodiment 1.

Finally, as shown in FIG. 9(A), it is possible to provide the substrate 3 which has the pixel pattern 3a consisting of the pattern elements arranged in a matrix and the gate line pattern 3b consisting of lines arranged in a lattice longitudinally and laterally formed thereon through exposure, and the driver pattern 3c and the tab pattern 3d in the periphery of the pixel pattern exposure region. FIG. 9(B) shows an enlarged view of a portion B in FIG. 9(A).

Embodiment 2

Figure 10:
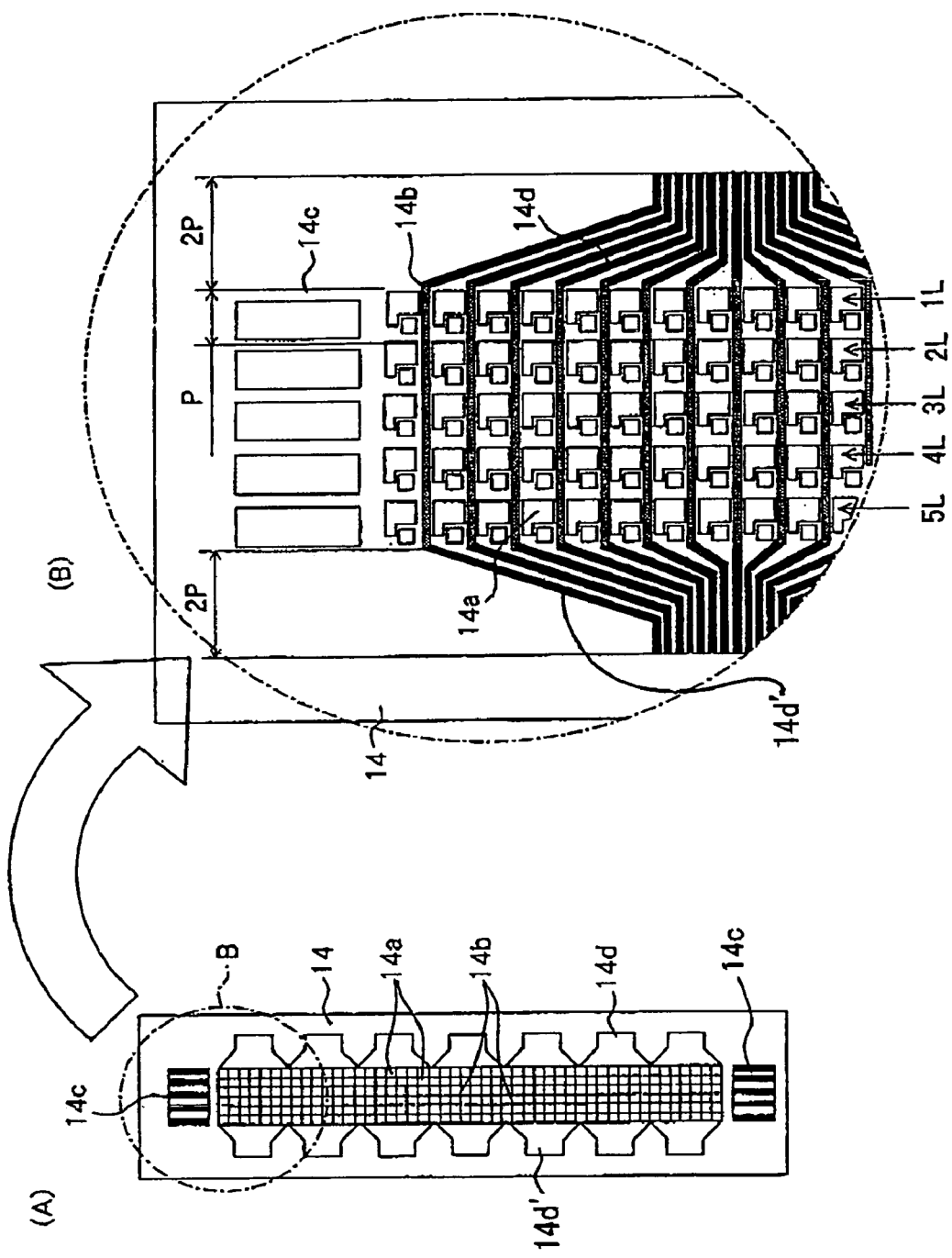
FIGS. 10(A) and 10(B) are explanatory views of an exposure mask for use in a liquid crystal substrate exposure apparatus which is Embodiment 2 of the present invention.

FIG. 10(A) shows a mask 14 which has a pixel mask pattern 14a, a gate line mask pattern 14b, and a driver mask pattern 14c, similarly to the mask described in Embodiment 1, and also has a tab mask pattern (a third mask pattern) 14d for exposing a substrate 3 to form a tab pattern (a wiring pattern to each gate line) thereon as a single pattern. FIG. 10(B) is an enlarged view of a portion B in FIG. 10(A).

In Embodiment 2, the tab mask patterns 14d and 14d' are set to have double the width of a pitch P of columns of the pixel mask pattern 14a, respectively. The tab mask pattern closer to a pixel mask pattern column 1L is referred to as a first tab mask pattern 14d, and the tab mask pattern on the left closer to a pixel mask pattern column 5L is referred to as a second tab mask pattern 14d'.

In the mask 14 used in Embodiment 2, light shield processing has been performed in a region thereof outside the portion in which the mask patterns are formed to prevent leakage of exposure light toward a projection lens 2 through the region in an early phase and a later phase of an exposure process, later described.

In the following description, components identical to those of the liquid crystal substrate exposure apparatus in Embodiment 1 are designated with the same reference numerals as those in Embodiment 1.

Embodiment 1 has been described for the case where the mask 4 is fixed from the beginning to the end of the exposure process, the substrate 3 is moved in a step manner, and the light shielding blades 9a and 9b are moved in a step manner in synchronization with the substrate 3 in the early and later phases of the exposure process. In Embodiment 2, the mask 14 is moved in a step manner in synchronization with step movement of the substrate 3 and light shielding blades 9a and 9b are not used in an early phase and a later phase of the exposure process.

In Embodiment 2, an illumination optical system 7 defines an illumination region with a width five times larger than a pitch of the pixel mask pattern 14a on the mask 14. The definition of the illumination region is achieved by a limiting slit plate 55 in the illumination optical system 7 as shown in FIG. 1.

Figure 11:
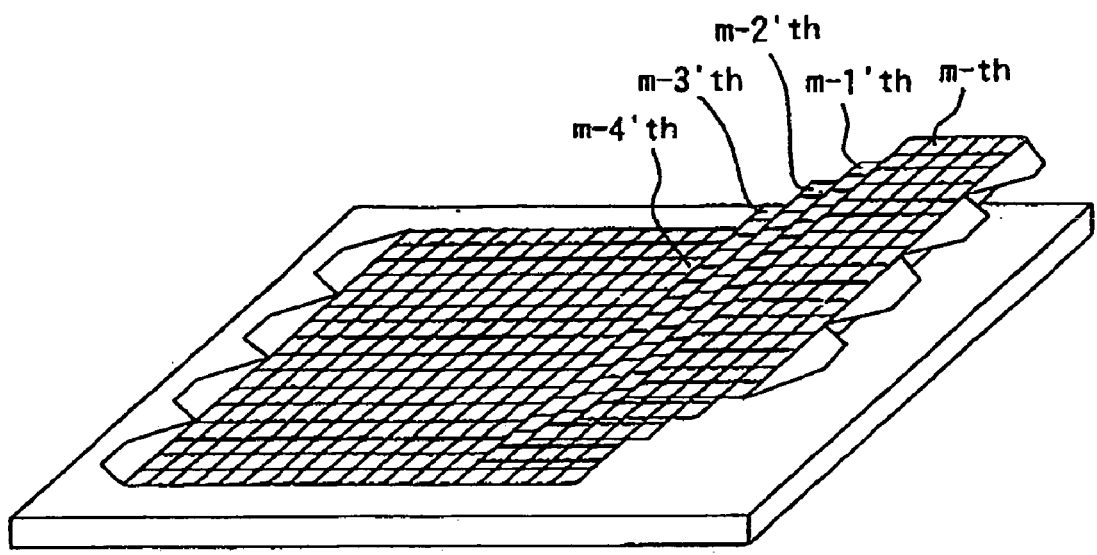
FIG. 11 schematically shows exposure of a substrate to expose a pattern thereon with the liquid crystal substrate exposure apparatus of Embodiment 2.

FIG. 11 shows the substrate 3, which is subjected to exposure for the tab pattern subsequent to exposure for the pixel pattern in a later stage of the exposure process. In Embodiment 2, each of an m-fifth shot to an m-th shot corresponding to the later stage of the exposure process is performed after the mask 14 and the substrate 3 are synchronously moved in a step manner in the same direction, to expose the tab pattern together with the pixel pattern (and the gate line pattern and the driver pattern).

Although not shown in FIG. 11, in an early phase of the exposure process, each of a second shot after a fifth shot to a sixth shot is performed after the mask 14 and the substrate 3 are synchronously moved in a step manner in the same direction, to expose the tab pattern and the pixel pattern (and the gate line pattern and the driver pattern).

Figure 12:
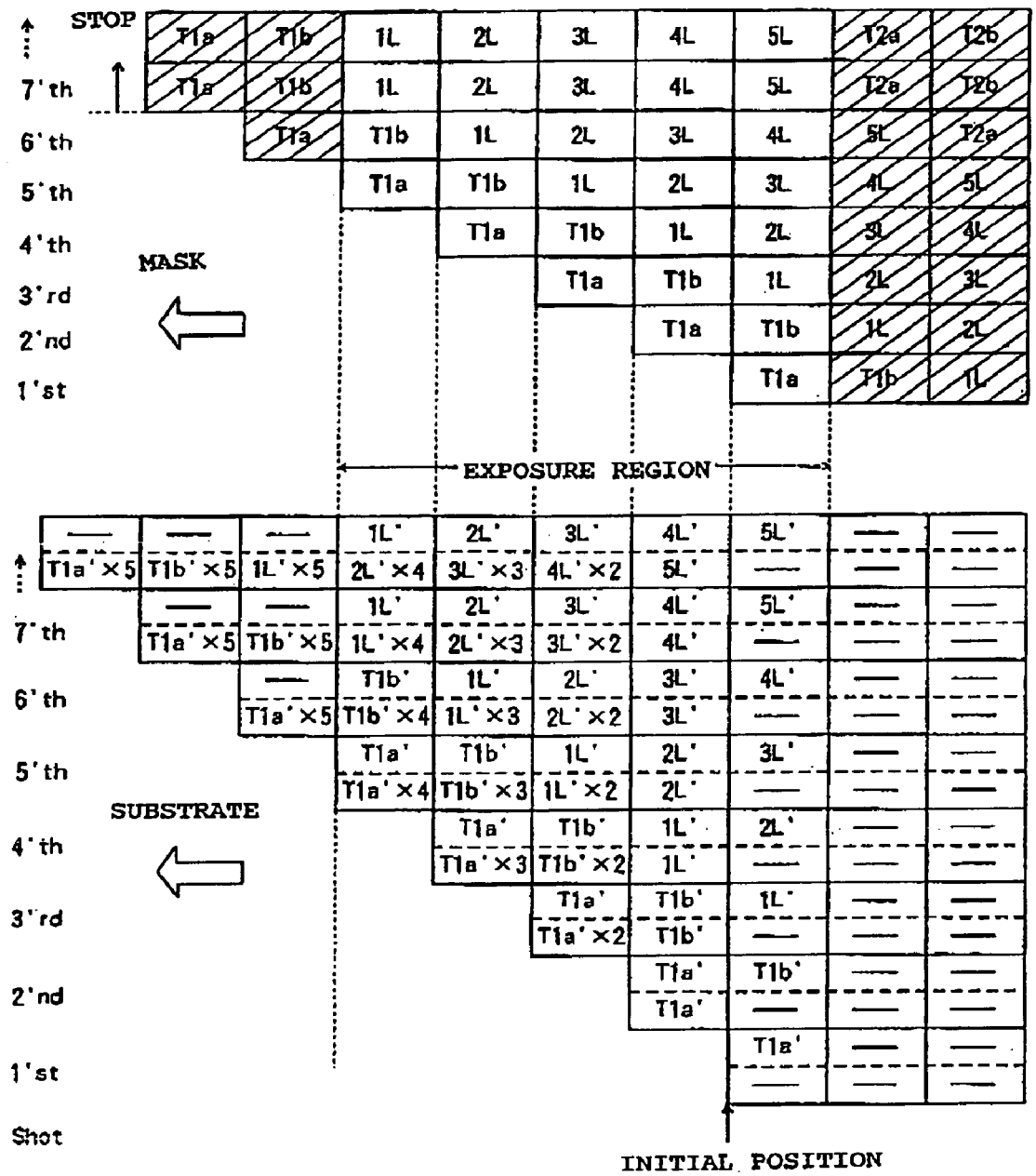
FIG. 12 is a schematic diagram for describing exposure of the substrate (in an early phase) to expose the pattern thereon with the liquid crystal substrate exposure apparatus of Embodiment 2.
Figure 13:
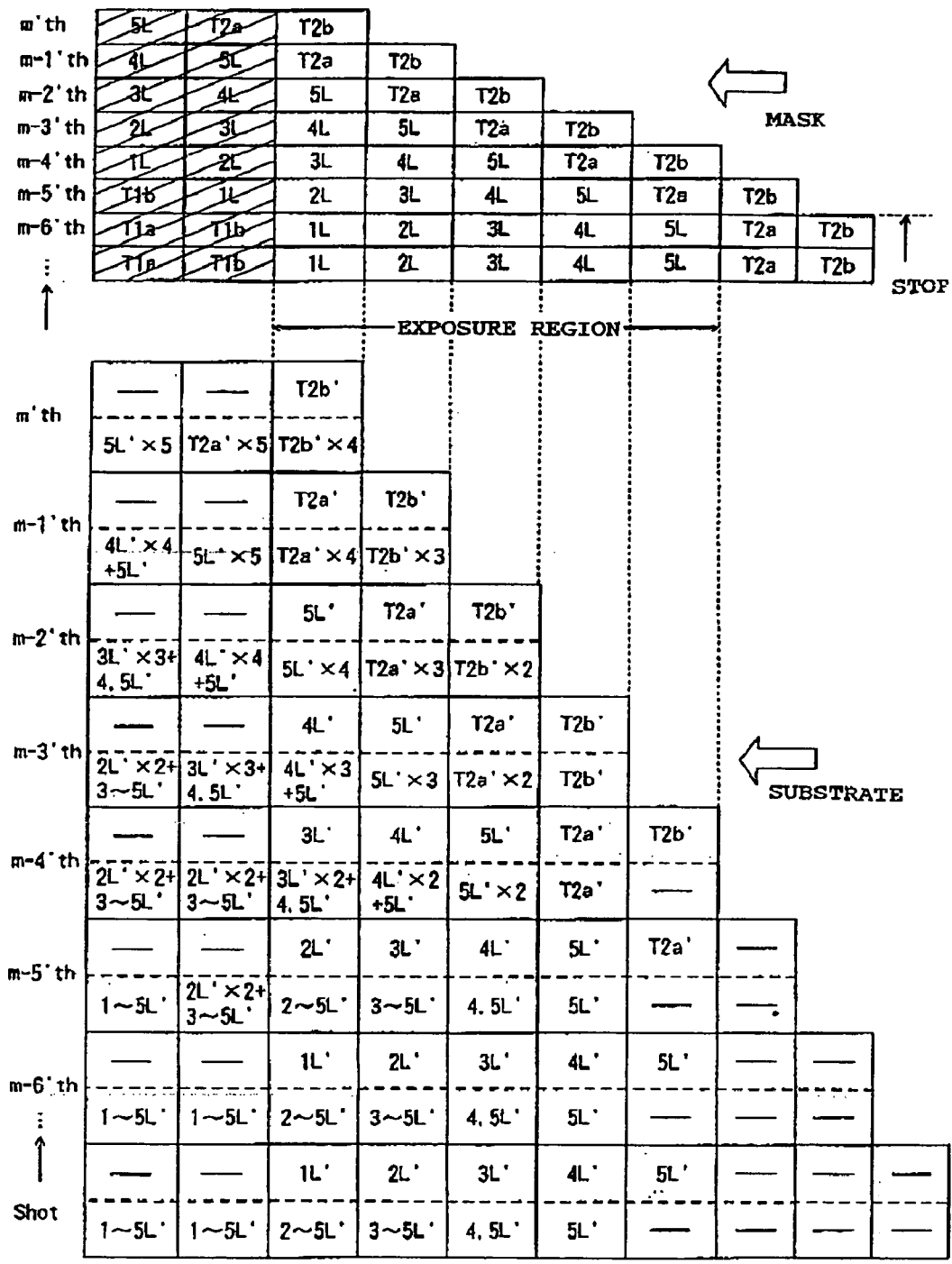
FIG. 13 is a schematic diagram for describing exposure of the substrate (in a later stage) to expose the pattern thereon with the liquid crystal substrate exposure apparatus of Embodiment 2.

FIGS. 12 and 13 schematically show the step movement of the mask 14, the step movement of the substrate 3, and actually exposed pixel pattern columns in the early and later phases of the exposure process.

In FIGS. 12 and 13, each upper section shows the pixel mask pattern and the tab mask pattern (the first mask pattern 14d and the second mask pattern 14d') on the mask 14, while a lower section shows the pixel pattern and the tab pattern exposed on the substrate 3 which is moved in a step manner to the left in FIGS. 12 and 13.

In the mask 14, the first tab mask pattern 14d has the width of 2×P as described above. Of the first tab mask pattern 14d, a portion having the width P away from the pixel mask pattern column 1L (on the outer side) is referred to as T1a, while a portion having the width P close to the pixel mask pattern column 1L (on the inner side) is referred to as T1b. The second tab mask pattern 14d' also has the width of 2×P. Of the second tab mask pattern 14d', a portion having the width P closer to the pixel mask pattern column 5L (on the inner side) is referred to as T2a, while a portion having the width P away from the pixel mask pattern column 5L (on the outer side) is referred to as T2b.

As shown in FIG. 12, in Embodiment 2, after the substrate 3 is moved to an initial position as described above, projection of exposure light (exposure) and step movement of the substrate 3 are alternately performed, similarly to Embodiment 1.

In Embodiment 2, however, together with the movement of the substrate 3 to the initial position, the mask 14 is moved to an initial position where the image of the outer portion T1a of the first tab mask pattern 14d is projected onto an exposure start position of the substrate 3.

Then, a first shot (exposure) is performed. In the first shot, the substrate 3 is exposed to form a pattern T1a' corresponding to the outer portion T1a of the first tab mask pattern 14d thereon.

Next, the substrate 3 and the mask 14 are moved in a step manner in the same direction. The step movement amount of the substrate 3 is the same as that described in Embodiment 1. The step movement amount of the mask 14 is equal to one pitch of the pixel mask pattern columns (n times larger than the pitch of the pixel mask pattern columns), and is the same as the step movement amount of the substrate 3 in Embodiment 2 in which a full-scale mask image is projected onto the substrate 3.

Then, a second shot is performed. In the second shot after the mask 14 is moved in a step manner in synchronization with the substrate 3, a pattern T1a' corresponding to the outer portion T1a of the first tab mask pattern 14d is formed through superposed exposure on the pattern T1a' exposed in the first shot and a pattern T1b' corresponding to the inner portion T1b of the first tab mask pattern 14d is exposed on the right of the pattern T1a'.

Next, the substrate 3 and the mask 14 are moved in a step manner in the same direction, and then a third shot is performed. In the third shot, a pattern T1a corresponding to the outer portion T1a of the first tab mask pattern 14d is formed through superposed exposure on the pattern T1a exposed in the first and second shots, and a pattern T1b corresponding to the inner portion T1b of the first tab mask pattern 14d is exposed through superposed exposure on the pattern T1b formed in the second shot. On the right of the pattern T1b, a pixel pattern column 1L corresponding to the pixel mask pattern column 1L is newly exposed. When each pixel pattern column is exposed, a portion of the gate line pattern and a portion of the driver pattern present in the exposure region are also exposed simultaneously with the corresponding pixel mask pattern column in the illumination region.

Thereafter, the step movement of the substrate 3 and the mask 14 and the exposure are repeated similarly until a fifth shot. When the outer portion T1a of the first tab mask pattern 14d reaches the leftmost portion of the exposure region, five exposures achieved by superposed exposure are completed for the pattern T1a corresponding to the outer portion T1a of the first tab mask pattern 14d. At this point, four exposures achieved by superposed exposure have been performed on the pattern T1b corresponding to the inner portion T1b of the first tab mask pattern 14d, three exposures achieved by superposed exposure have been performed on the pixel pattern column 1L, two exposures achieved by superposed exposure have been performed on the pixel pattern column 2L', and one exposure has been performed on the pixel pattern column 3L'.

In addition, each of a sixth shot and a seventh shot is performed after the step movement of the substrate 3 and the mask 14. In the sixth and seventh shots, since the outer portion T1a of the first tab mask pattern 14d lies outside the illumination region (the exposure region), the pattern T1a is not subjected to superposed exposure more than five times. The pattern T1b on which the fifth exposure is performed in the sixth shot, is not subjected to exposure in the seventh shot since the inner portion T1b of the first tab mask pattern 14d lies outside the illumination region.

At the time when the seventh shot is completed, the pixel mask pattern columns 1L to 5L are present in the illumination region on the mask 14.

After the seventh shot is completed, the mask 14 is stopped (fixed), and only the substrate 3 is moved in a step manner as before to continue exposure. Thus, the images of the pixel mask pattern columns 1L to 4L (1L to 4L are formed through superposed exposure on the previously exposed pixel pattern columns, and the image of a pixel mask pattern mask column 5L (5L is newly exposed in the rightmost portion of the exposure region. It should be noted that, after the mask 14 is stopped, the previously exposed pixel pattern column is overlaid by the image of a pixel mask pattern column different from the pixel mask pattern column corresponding to that previously exposed pixel pattern column through superposed exposure, but no problem occurs since all the pixel mask pattern columns have the same shape.

Next, a description is made of the later stage of the exposure process with reference to FIG. 13. At the time when an m-sixth shot is completed after only the substrate 3 is moved in a step manner, the substrate 3 has pixel pattern columns formed thereon which have been subjected to exposures five times, four times, three times, and twice, from the left of the exposure region, and a pixel pattern column which has been subjected to exposure once.

Then, the step movement of the mask 14 in synchronization with the substrate 3 is again started as in the early phase. This results in the pixel mask pattern columns 2L to 5L and the inner portion T2a of the second tab mask pattern 14d' present in the illumination region on the mask 14. When the m-fifth shot is performed in this state, the substrate 3 is exposed to form pixel pattern columns 2L to 5L superposed on the previously formed pixel pattern columns 2L to 5L and a pattern T2a' corresponding to the inner portion T2a of the second tab mask pattern 14d'.

After the m-fifth shot, the substrate 3 and the mask 14 are again moved synchronously in a step manner in the same direction and an m-fourth shot is performed. The substrate 3 is exposed to form pixel pattern columns 3L to 5L and a pattern T2a superposed on the previously formed pixel pattern columns 3L to 5L and the pattern T2a respectively, and a pattern T2b corresponding to the outer portion T2b of the second tab mask pattern 14'.

Thereafter, the substrate 3 and the mask 14 are moved in a step manner and then each shot is performed until the last m'th shot as in the early phase. When an m-second shot is performed, five exposures achieved by superimposed exposure for the last pixel pattern column (5L are completed. Then, five exposures achieved by superposed exposure for the tab patterns T2a and T2b corresponding to the second tab mask patterns 14d' (T2a and Tb2) are completed. In this manner, a proper amount of exposure light can be provided for all the patterns exposed on the substrate 3.

As described above, the substrate 3 is exposed to form all the pixel pattern (a discontinuous cyclic pattern), the driver patterns (a discontinuous cyclic pattern), the gate line pattern (a continuous pattern), and the tab pattern (the single pattern) thereon with the proper amount of exposure light by using the mask 14 only through one series of exposure steps.

Figure 14:
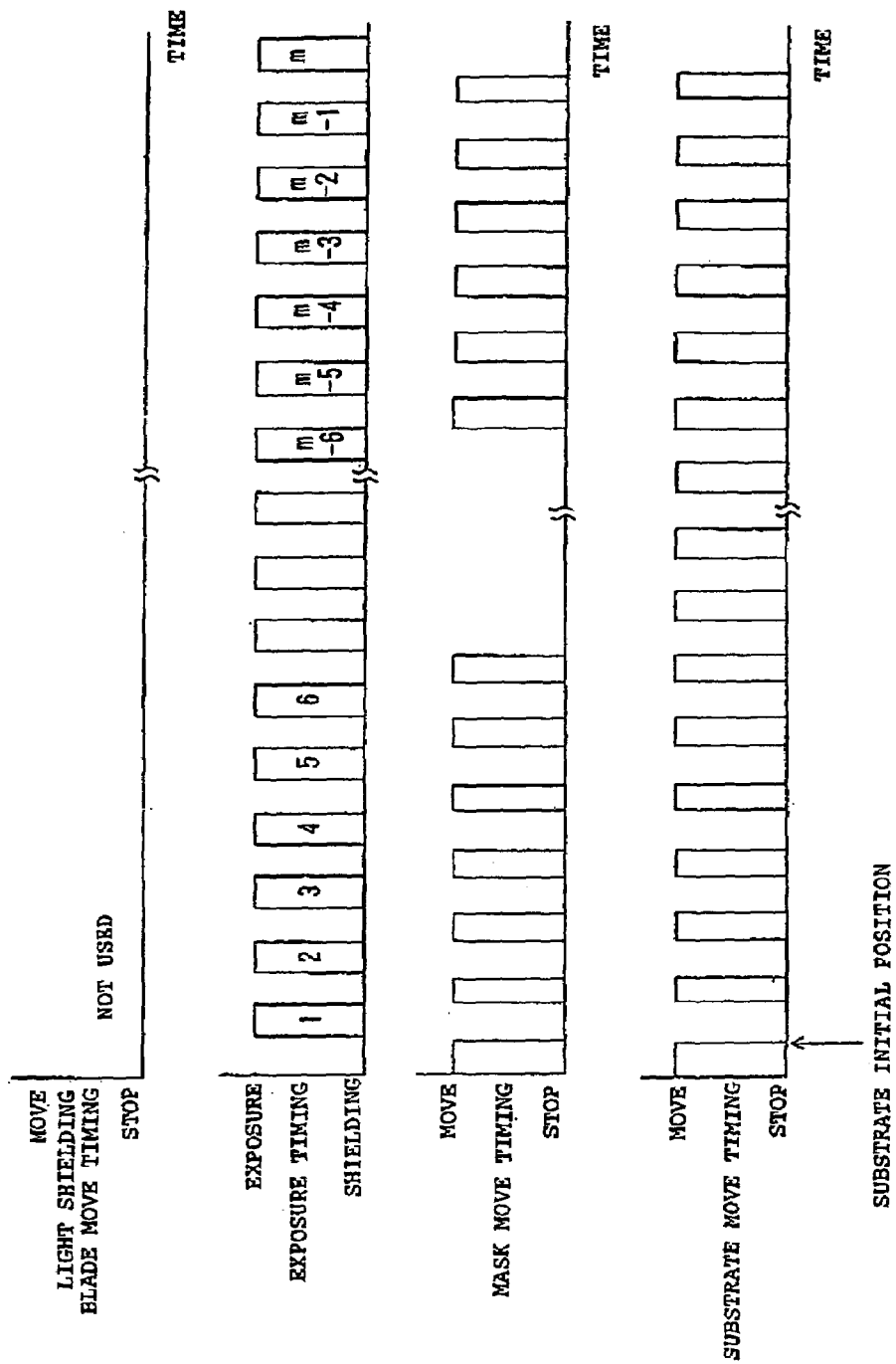
FIG. 14 shows operation timings in the liquid crystal substrate exposure apparatus of Embodiment 2.

FIG. 14 shows timings of the projection of the exposure light (light emission of a light source 56), the movement of the mask 14 (driving of a mask stage 1), and the movement of the substrate 3 (driving of a substrate stage 5) in the series of the exposure steps.

As shown in FIG. 14, first, the substrate 3 is moved to the aforementioned initial position, and the mask 14 is also moved to the initial position where only the first tab mask pattern T1a exists in the illumination region. Then, as described with reference to FIG. 12, each shot (exposure) corresponding to the projection of exposure light and step movement of the substrate 3 and the mask 14 are alternately performed in the early phase of the exposure process.

Thereafter, each shot (exposure) and step movement of the substrate 3 are alternately performed.

When the later stage of the exposure process is entered, shot and step movement of the substrate 3 and the mask 14 are again performed alternately.

Figure 15:
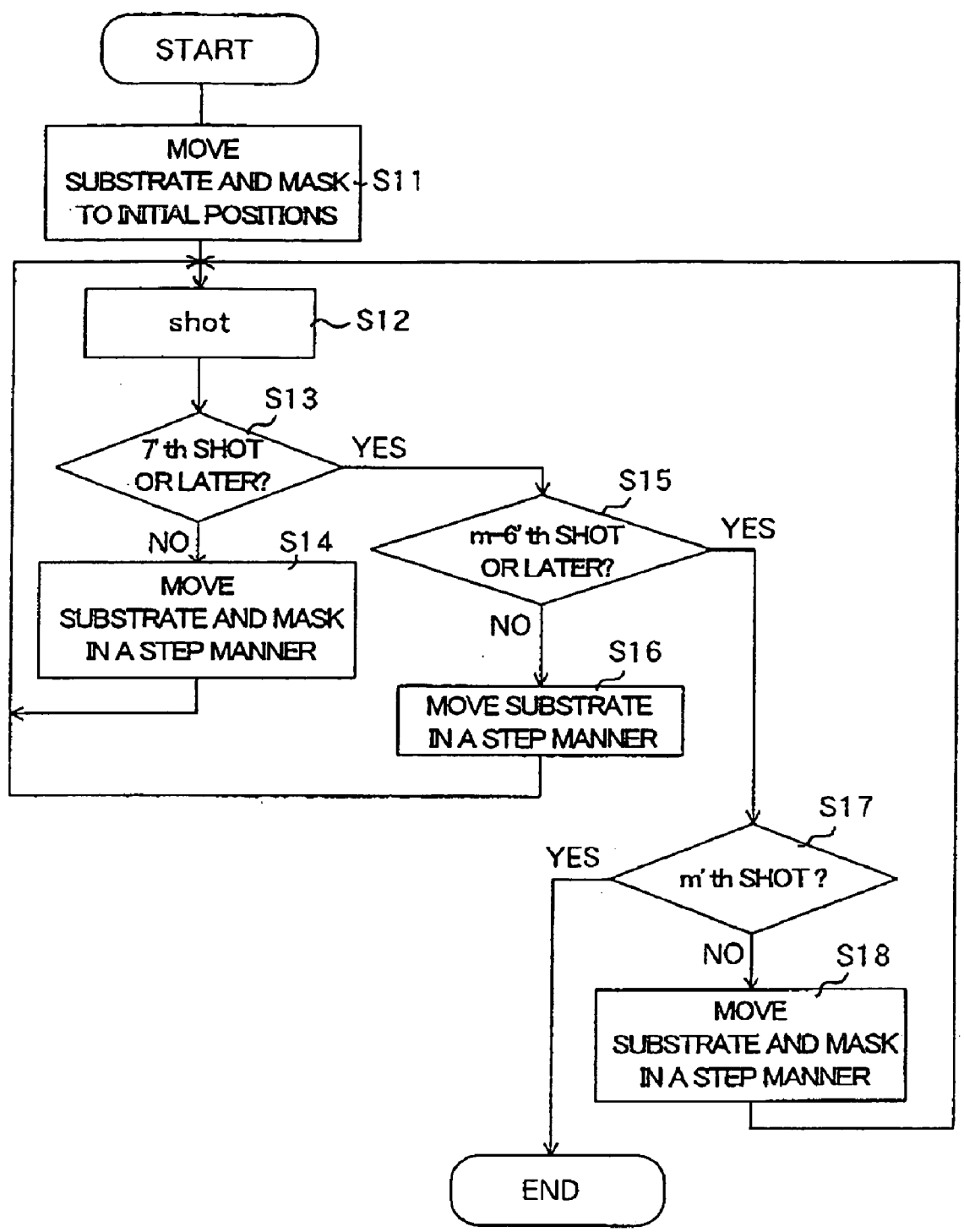
FIG. 15 is a flow chart for showing operation of the liquid crystal substrate exposure apparatus of Embodiment 2.

FIG. 15 is a flow chart of operation of a control circuit 8a in the aforementioned series of the exposure steps. A description is hereinafter made for the operation flow chat in conjunction with FIG. 1.

First, at step S11, the control circuit 8a drives the substrate stage 5 and the mask stage 1 to move the substrate 3 and the mask 14 to the aforementioned initial positions, respectively. This starts the exposure process.

Next, at step S12, a shot (exposure) is performed. At this point, the control circuit 8a increments the shot count by one.

Then, at step S13, the control circuit 8a determines whether or not the shot at step S12 is the seventh shot or later based on the shot count. If the shot does not reach the seventh shot, the flow proceeds to step S14 and the control circuit 8a synchronously moves the substrate 3 and the mask 14 in a step manner. Then, the flow returns to step S12 to again perform a shot (exposure).

On the other hand, if it is determined at step S13 that the shot at step S12 is the seventh shot or later, the flow proceeds to step S15, and the control circuit 8a determines whether or not the shot at step S12 is the m-sixth shot or later. If it is determined at step S15 that the shot does not reach the m-sixth shot, the flow proceeds to step S16 and the control circuit 8a moves only the substrate 3 in a step manner and stops the mask 14. Then, the flow returns to step S12 to again perform a shot (exposure).

On the other hand, if it is determined at step S15 that the shot at step S12 is the m-sixth or later, the flow proceeds to step S17 and the control circuit 8a determines whether or not the shot at step S12 is the last shot (the m-th shot). It should be noted that m represents the total number of exposures (the number of shots) required for exposing the substrate 3 to form all the circuit patterns thereon with the mask 14, and is previously set through input by a user or the like.

If it is determined at step S17 that the shot does not reach the last shot (the m'th shot), the flow proceeds to step S18 and the control circuit 8a synchronously moves the substrate 3 and the mask 14 in a step manner. Then, the flow returns to step s12 to again perform a shot (exposure).

If it is determined at step S17 that the shot at step S12 is the last shot (the m'th shot), the control circuit 8a terminates the flow (that is, the exposure process).

According to Embodiment 2, similarly to Embodiment 1, the step movement of the substrate 3 can be combined with the superposed exposure for the pattern to realize proper exposure of the large substrate 3 while the small mask 14 is used. In addition, the aforementioned step movement can be combined with the superposed exposure for the pattern to relax the requirements of higher power of the light source 56 of the illumination system 7, improved transmittance (reflectivity) of the projection lens 2, and higher sensitivity of the photoresist applied to the substrate 3, so that so-called flash-on-the-fly can be achieved to improve throughput. In this case, smoothness and stability of the driving are needed in the substrate stage 5.

In addition, according to Embodiment 2, it is possible to perform the exposure for the discontinuous cyclic patterns (the pixel pattern and the driver pattern), the exposure for the continuous pattern (the gate line pattern), and the exposure for the single pattern (the tab pattern) in the series of the exposure steps.

After the aforementioned-exposure steps, the substrate 3 is exposed while it is moved in a step manner to form a gate line pattern along each pixel pattern column (that is, longitudinal direction) by using another mask, not shown (for example, a mask having five gate line mask pattern columns formed thereon), as in the exposure with the mask 4 in Embodiment 1.

Finally, as shown in FIGS. 9(A) and 9(B), it is possible to provide the substrate 3 which has the pixel pattern 3a consisting of pattern elements arranged in a matrix and the gate line pattern 3b consisting of lines arranged in a lattice vertically and laterally exposed thereon, and the driver pattern 3c and the tab pattern 3d in the periphery of the pixel pattern exposure region.

In Embodiment 2, light shield processing has been performed in the region of the mask 14 outside the portion in which the mask patterns are formed to prevent leakage of exposure light through the region in the early and later phases of the exposure process. In this case, the mask 14 needs to be larger since the light shielding region is formed thereon. It is thus possible, alternatively, that light shielding blades 9a and 9b are used to prevent leakage of exposure light from the region outside the mask patterns.

Specifically, prior to the first shot in the early phase shown in FIG. 12, the light shielding blade 9a is moved to a position where it shields exposure light through a region between the outer portion T1a of the first tab mask pattern 14d and the left end of the exposure region. The light shielding blade 9a is moved in a step manner after the end of each of the second to fourth shots to prevent leakage of exposure light from that region. The step movement amount of the light shielding blade 9a corresponds to the step movement amount of the mask 14 and is equal to an amount for changing the projection region on the substrate 3 by n columns (n is equal to 1 in Embodiment 2) of the mask pattern (that is, a movement amount corresponding to a pitch equal to one (n) column of the pixel mask pattern in the projection region on the substrate 3).

In addition, for each of the m-fourth shot to m-first shot shown in FIG. 13, in the later stage, the light shielding blade 9b is moved in a step manner by the amount identical to the aforementioned amount to a position where it shields exposure light through a region between the outer portion T2b of the second tab mask pattern 14d' and the right end of the exposure region to prevent leakage of exposure light from that region.

This eliminates the need to provide the portion of the mask light shielding region in the mask, so that the mask can be reduced in size. Alternatively, the limiting slit plate 55 may have the same functions.

The masks described in Embodiments 1 and 2 are only illustrative. The number of the columns of the pixel mask pattern, the number of the pixels included in each column, the number and shape of the gate line pattern and the tab mask pattern and the like are not limited to those described in Embodiments 1 and 2.

Embodiment 3

Next, a description is made of a method of manufacturing a liquid crystal display panel (a semiconductor device) by using the projection exposure apparatus described in each of Embodiments 1 and 2.

Figure 16:
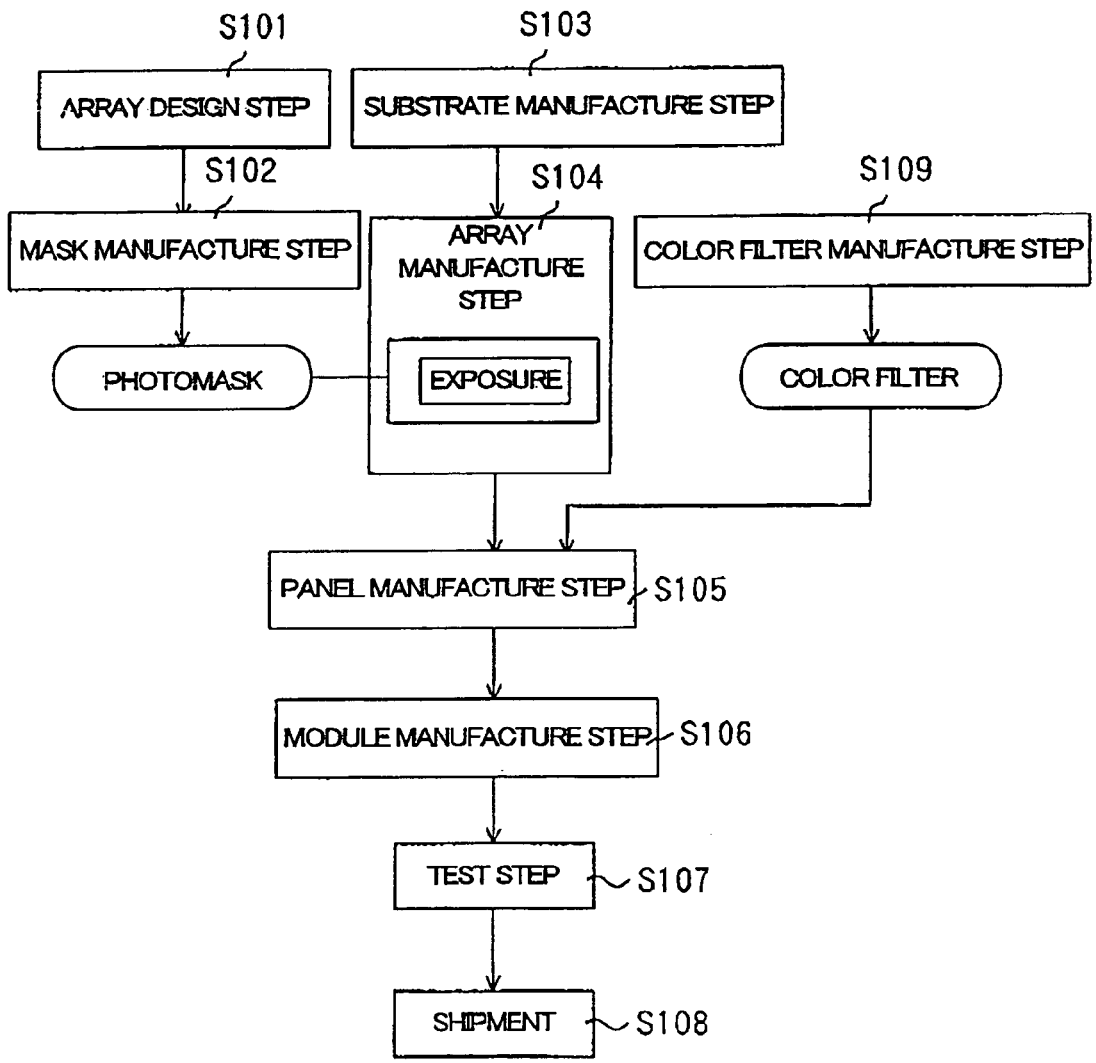
FIG. 16 is a flow chart for showing manufacture of a liquid crystal display panel in Embodiment 3 of the present invention including the exposure step in which the liquid crystal substrate exposure apparatuses of Embodiments 1 and 2 are used.

FIG. 16 is a flow chart for manufacturing the liquid crystal display panel. In Embodiment 3, at step S101 (an array design step), circuit design of a liquid crystal array is performed. At step S102 (a mask manufacture step), a mask is formed to have a mask pattern corresponding to the designed circuit.

At step S103 (a substrate manufacture step), a glass substrate is manufactured as a substrate to be exposed. Step S104 (an array manufacture step) is a so-called "pre-process" at which the mask prepared at step S102 is used to form an actual array circuit on the glass substrate through a lithography technique.

At step S104, the exposure process described in Embodiments 1 and 2 is performed. Thus, the method of manufacturing a glass substrate according to Embodiment 3 includes the steps of preparing a mask (steps S101 to S102) and the exposure step (step S104) using the mask and shown in Embodiments 1 and 2. The array manufacture step at step S104 is later described in detail.

Step S105 (a panel manufacture step) subsequent thereto is a so-called "post-process" at which the glass substrate having the circuit pattern formed thereon through exposure manufactured at step S104 is cemented to a color filter formed at another step (step S109), the peripheral portions thereof are sealed, and liquid crystal is injected therebetween. In this manner, a main body of the liquid crystal display panel is provided.

At step S106 (a module manufacture step), a tab, a backlight and the like are mounted on the main body of the liquid crystal display panel manufactured at step S105 to provide a liquid crystal display panel module. Then, at step S107 (a test step), the liquid crystal display panel module after burn-in is subjected to testing such as an operation check test and a durability test. Through these steps, the liquid crystal display panel is completed and then shipped at step S108.

Figure 17:
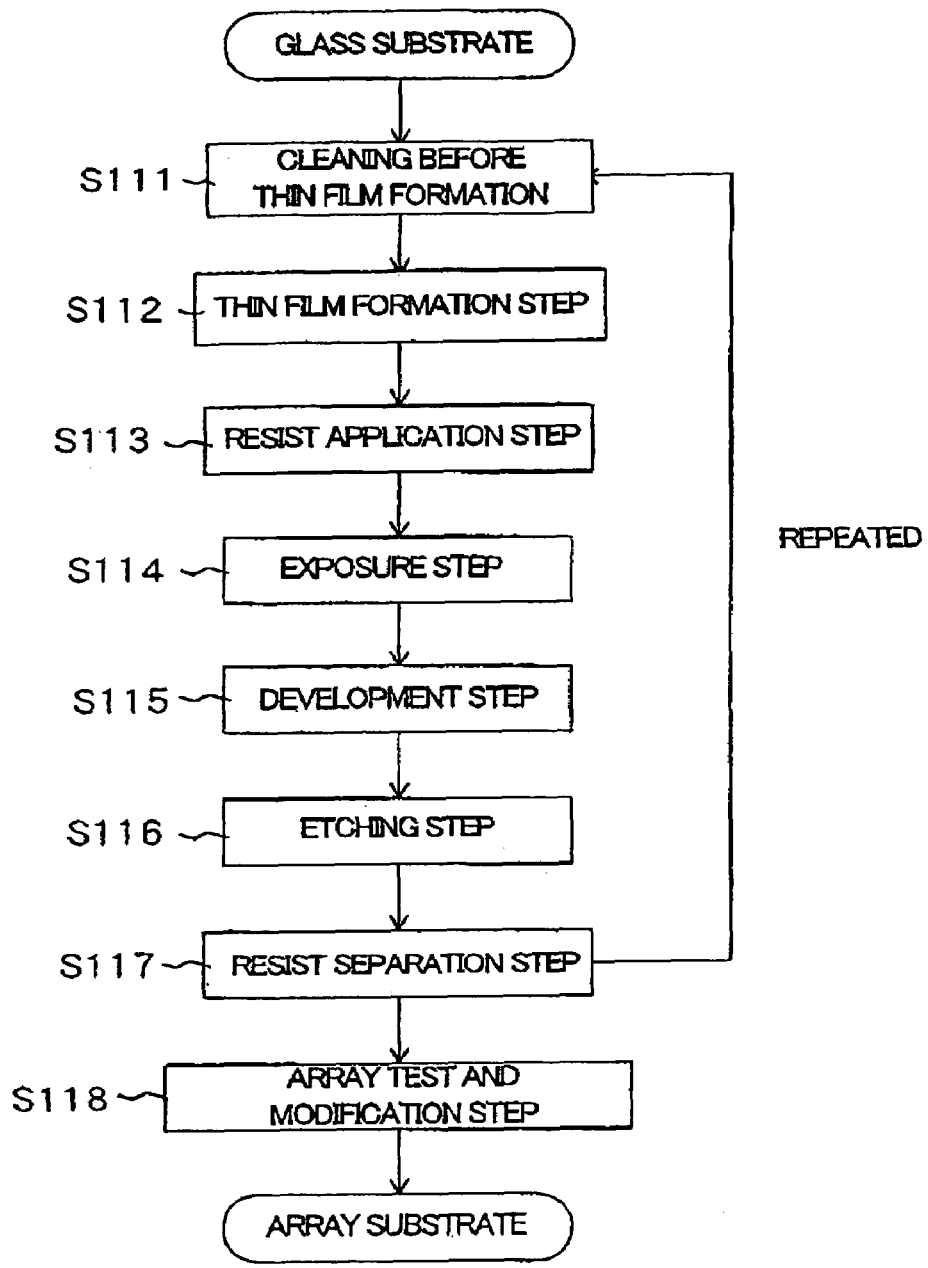
FIG. 17 is a flow chart of the exposure step in FIG. 16.

FIG. 17 is a flow chart for describing in detail the array manufacture step at step S104 described above. First, at step S111 (cleaning before thin film formation), a cleaning step is performed as a pretreatment for forming a thin film on a surface of the glass substrate.

Next, at step S112 (a thin film formation step), a thin film is formed on the surface of the glass substrate with a PCVD method. Then, at step S113 (a resist application step), a desired photoresist is applied to the surface of the glass substrate and baking is performed.

At step S114 (an exposure step), the liquid crystal substrate exposure apparatus and the mask described in Embodiments 1 and 2 are used to expose the glass substrate to form the array circuit pattern thereon (on the photoresist).

At step S115 (a development step), the circuit pattern exposed on the glass substrate is developed. Next, at step S116 (an etching step), etching is performed to remove the portion of the photoresist other than the developed portion. At step S117 (a resist separation step), the photoresist which is unnecessary after the etching is removed. These steps are repeatedly performed to form a multiplicity of circuit patterns on the glass substrate. At step 118, the glass substrate having the circuit pattern formed thereon is subjected to tests, modifications and the like, and then is used as a completed glass substrate (an array substrate) in the panel manufacture step at step S105 in FIG. 16.

With the manufacturing method of Embodiment 3, a liquid crystal display panel can be easily manufactured with high accuracy.

Embodiment 4

In the following, an example of the mask is shown which can be used in the liquid crystal substrate exposure apparatuses described in Embodiments 1 and 2.

Figure 18:
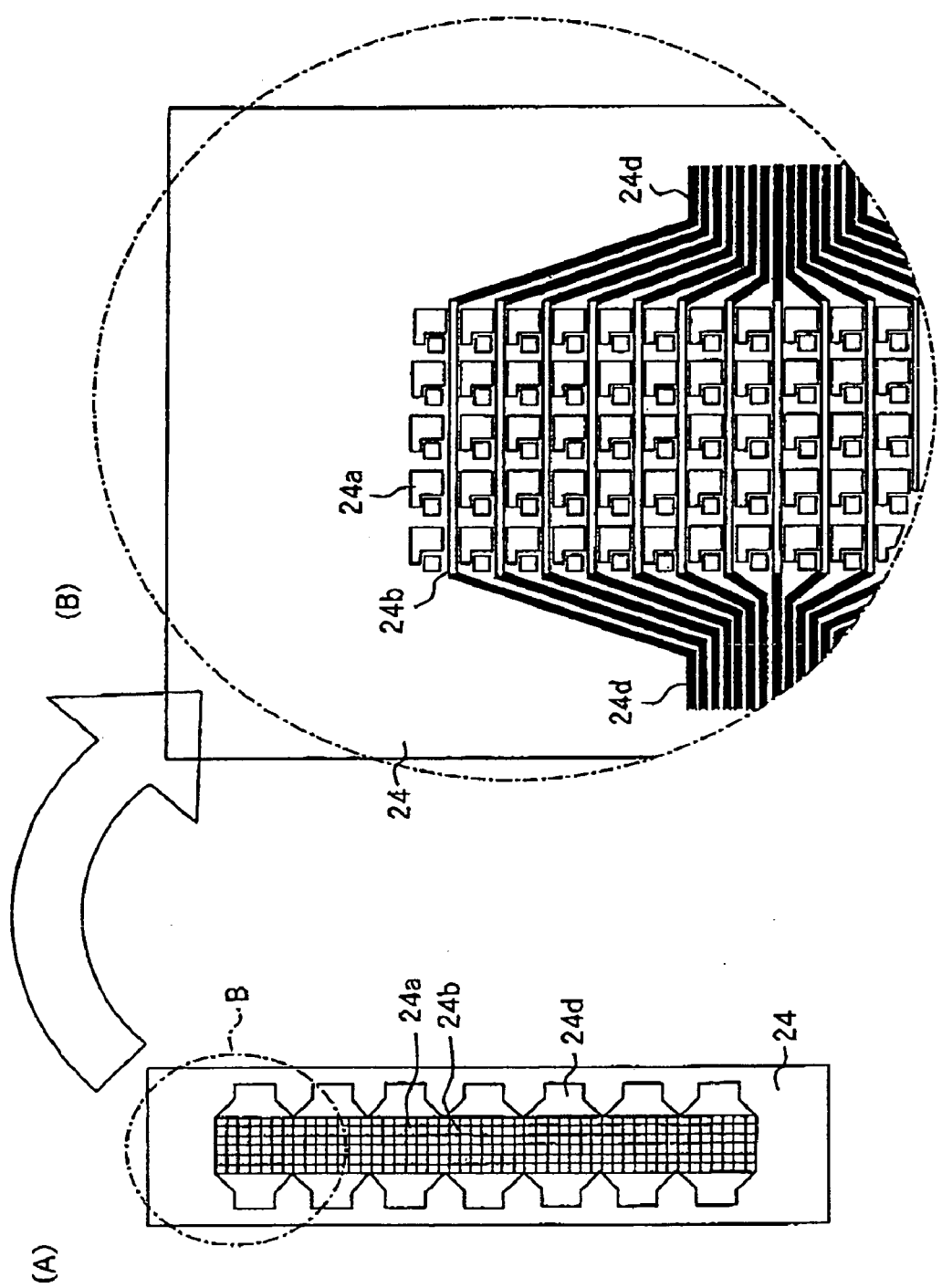
FIGS. 18(A) and 18(B) are explanatory views of an exposure mask for use in a liquid crystal substrate exposure apparatus of Embodiment 4 of the present invention.

FIG. 18(A) shows a mask 24 serving as Embodiment 4. The mask 24 corresponds to the mask 14 described in FIG. 10(A) of Embodiment 2 from which the driver pattern 14c is removed. Specifically, the mask 24 has a pixel mask pattern 24a consisting of pattern elements of five columns, a gate line mask pattern 24b, and a tab mask pattern 24d which is formed on both sides of the arranged columns (in a left-right direction in FIG. 18(A)) of the pixel mask pattern 24a. FIG. 18(B) is an enlarged view of a portion B in FIG. 18(A).

The mask 24 is used to perform an exposure process as in Embodiment 2 on a substrate. The two masks 34 each having only the tab mask pattern 34d shown in FIGS. 8(A) and 8(B) are also used (but the masks 34 are disposed orthogonally to the arrangement direction shown in FIG. 8(A)) to expose the substrate to form a tab pattern in a portion where no tab pattern is formed by the mask 24 (on both sides in a direction orthogonal to the step movement direction of the substrate 3) in the periphery of a pixel pattern exposure region on the substrate.

In addition, the substrate 3 is exposed while it is moved in a step manner to form a (longitudinal) gate line pattern along each pixel pattern column by using another mask (not shown) (for example, a mask having five gate line mask pattern columns), as in the exposure with the mask 4 in Embodiment 1.

Figure 19:
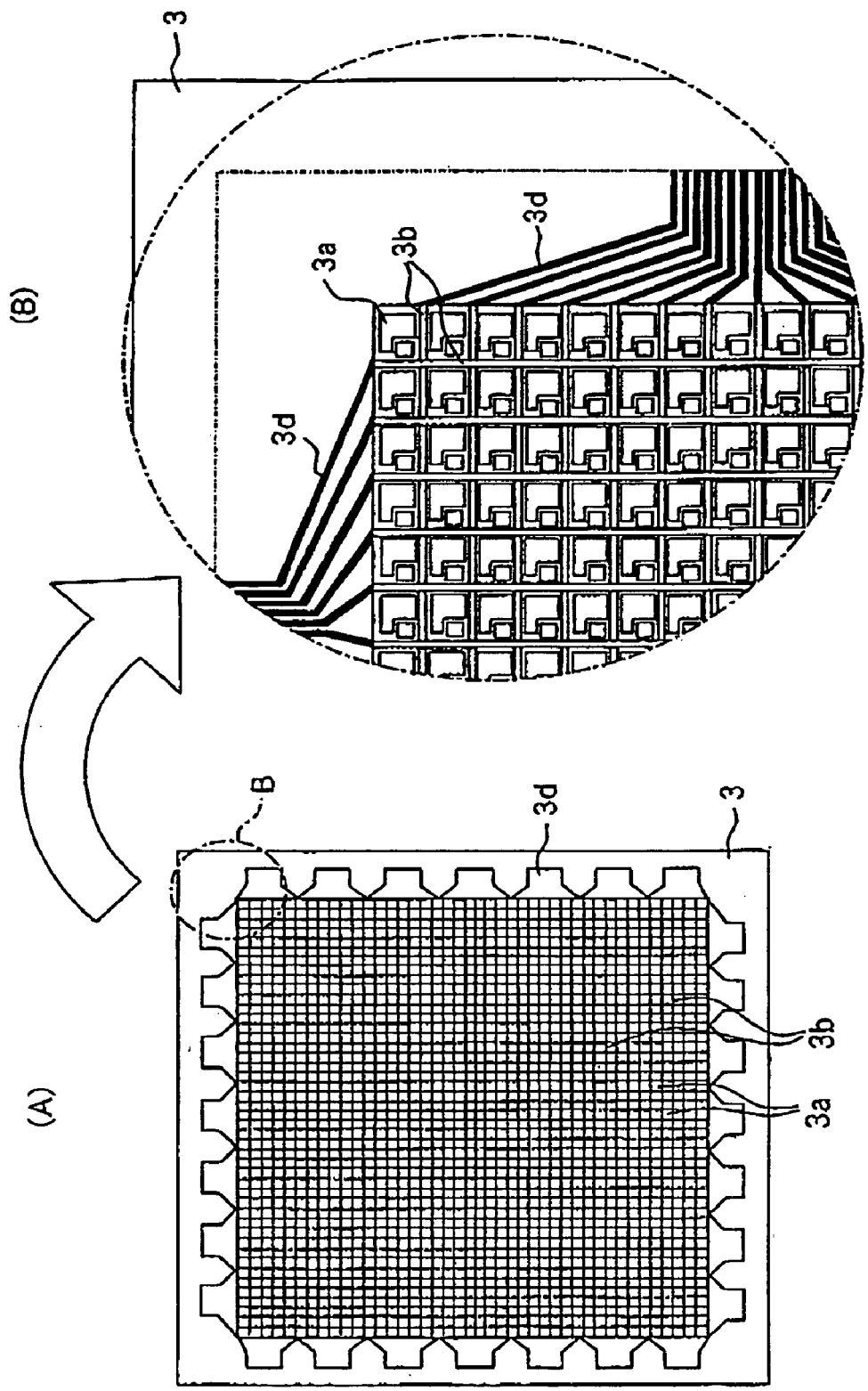
FIGS. 19(A) and 19(B) are explanatory views of a substrate exposed by the liquid crystal substrate exposure apparatus of Embodiment 4.

Finally, as shown in FIG. 19(A), it is possible to provide the substrate 3 which has a pixel pattern 3a consisting of the pattern elements arranged in a matrix, a gate line pattern 3b consisting of lines arranged in a lattice longitudinally and laterally exposed thereon, and a tab pattern 3d in the periphery of the pixel pattern exposure region. FIG. 19(B) shows an enlarged view of a portion B in FIG. 19(A).

Embodiment 5

Figure 20:
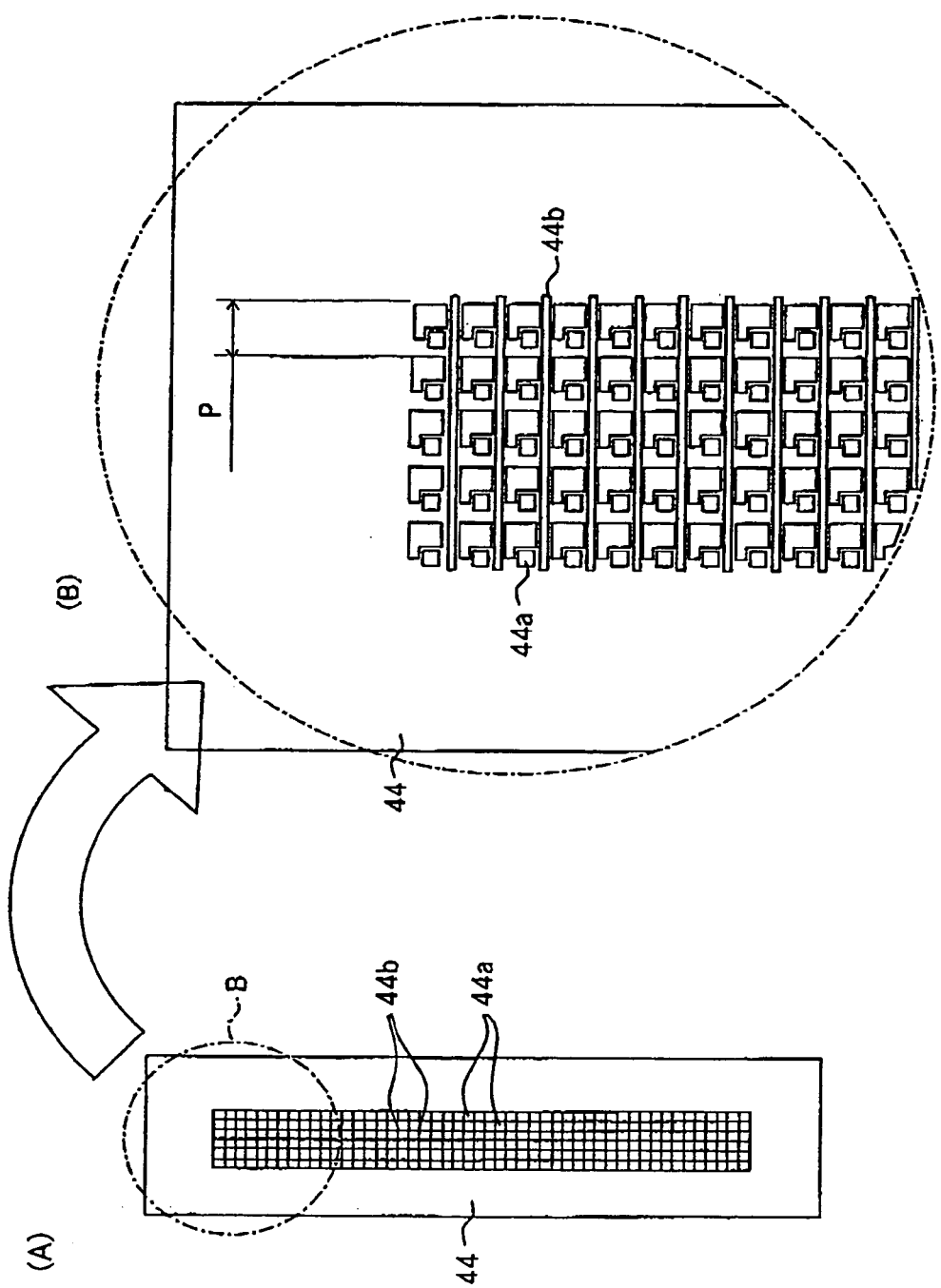
FIGS. 20(A) and 20(B) are explanatory views of an exposure mask for use in a liquid crystal substrate exposure apparatus of Embodiment 5 of the present invention.

FIG. 20(A) shows a mask 44 serving as Embodiment 5. The mask 44 corresponds to the mask 4 described in FIG. 2(A) in Embodiment 1 from which the driver pattern 4c is removed. In other words, the mask 44 has only five pixel mask pattern columns 44a. FIG. 20(B) is an enlarged view of a portion B in FIG. 20(A).

Figure 21:
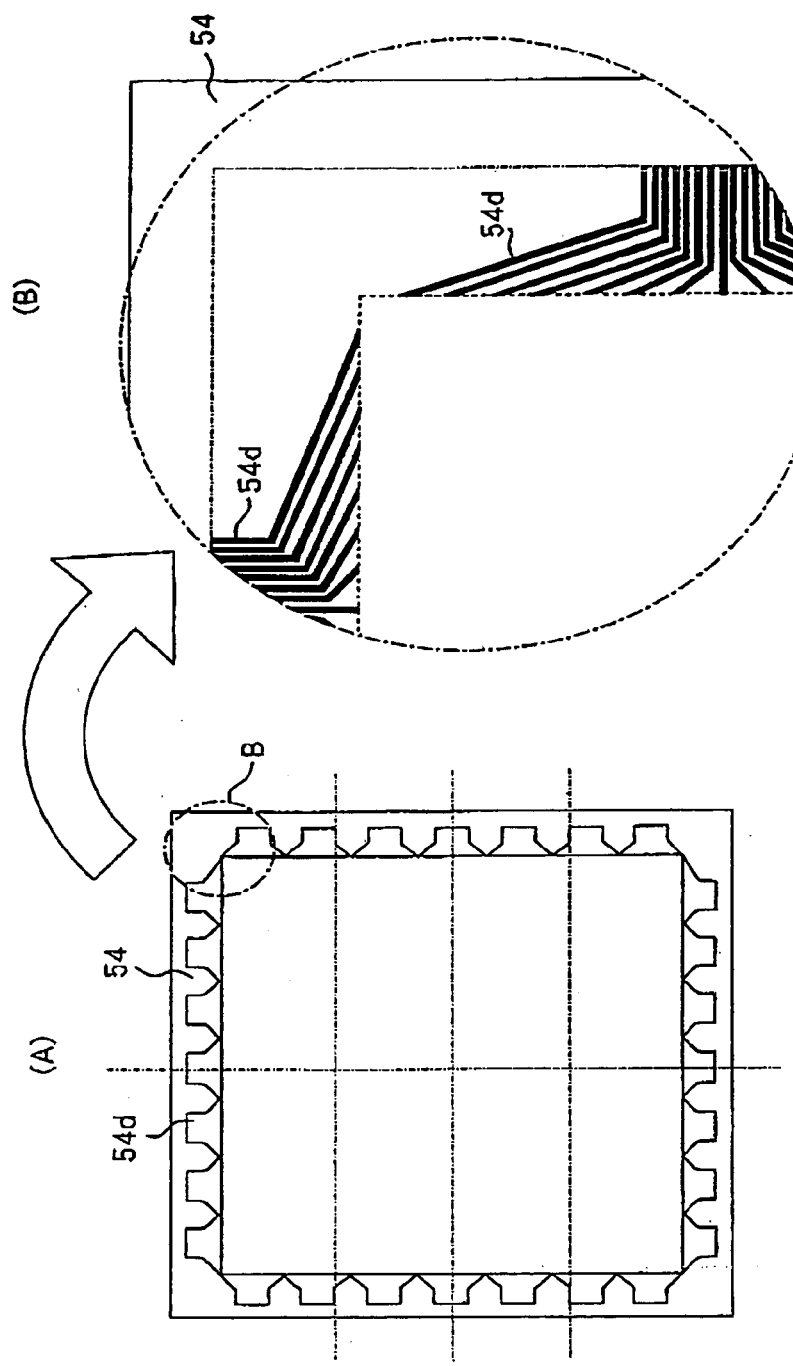
FIGS. 21(A) and 21(B) are explanatory views of another exposure mask for use in Embodiment 5.
Figure 22:
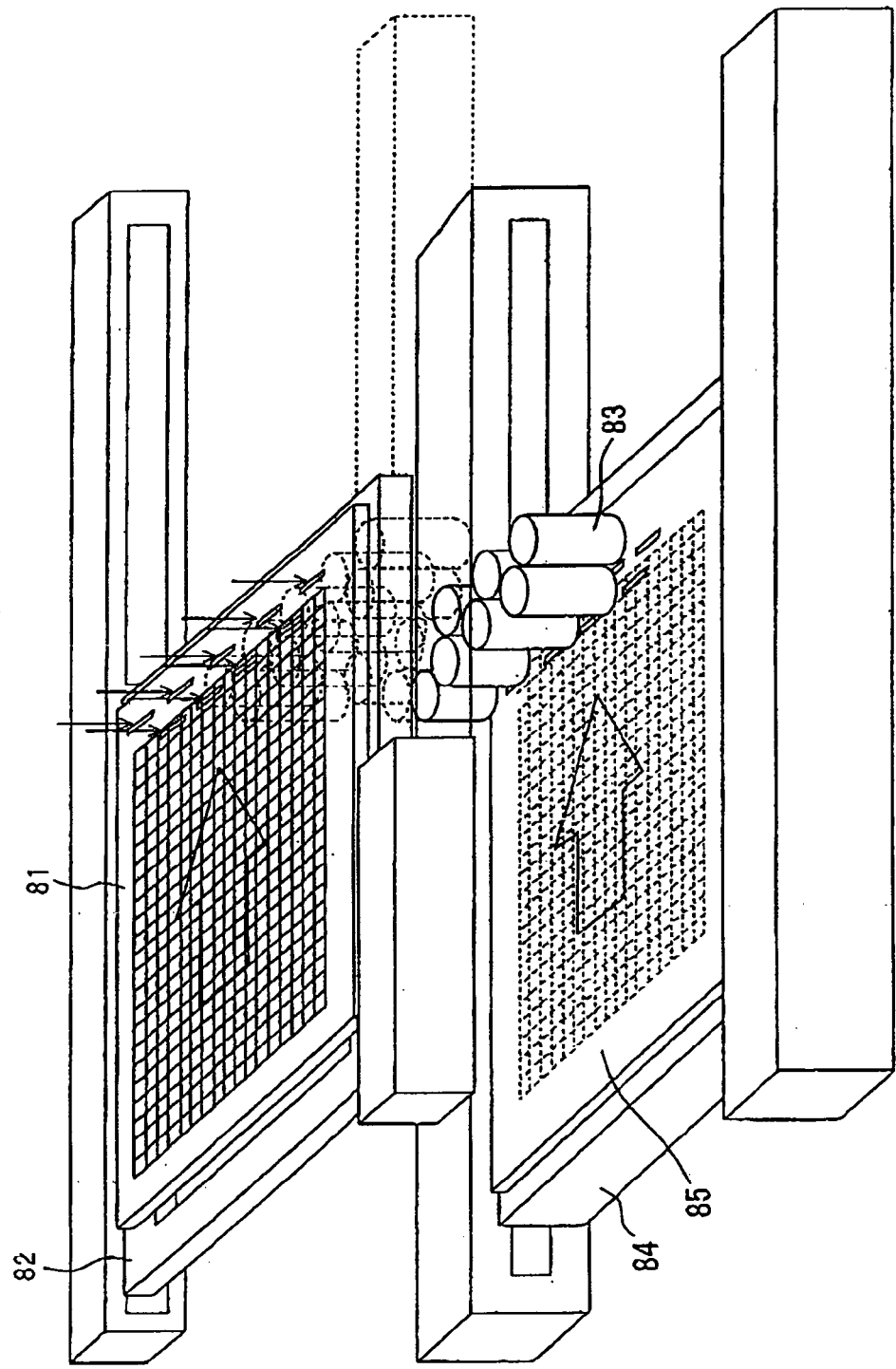
FIG. 22 is a schematic diagram showing main portions of a conventional scan type exposure apparatus.

The mask 44 is used to perform an exposure process as in Embodiment 1 on a substrate. A mask 54 in a frame-like shape having only a tab mask pattern 54d in four sides shown in FIG. 21(A) is also used to expose the substrate to form a tab pattern in the periphery of a pixel pattern exposure region thereon.

In addition, the substrate 3 is exposed while it is moved in a step manner to form a (longitudinal) gate line pattern along each pixel pattern column by using another mask (not shown) (for example, a mask having five gate line mask pattern columns), as in the exposure with the mask 4 in Embodiment 1.

Finally, as shown in FIGS. 19(A) and 19(B), it is possible to provide the substrate 3 which has the pixel pattern 3a consisting of pattern elements arranged in a matrix, the gate line pattern 3b consisting of lines arranged in a lattice longitudinally and laterally exposed thereon, and the tab pattern 3d in the periphery of the pixel pattern exposure region.

Embodiments 1 to 5 are provided for facilitating understanding of the present invention and are not described for limiting the present invention. Therefore, each component disclosed in Embodiments 1 to 5 described above should allow any of design changes or equivalents belonging to the technical field of the present invention.

For example, while Embodiments 1 to 5 have been described for the scan type exposure apparatus of a lens projection type for forming a full-scale image of the mask, the present invention is applicable to an exposure apparatus for illuminating a mask with illumination luminous flux in an arc shape. For example, the present invention is applicable to a projection exposure apparatus of a scan type which has an optical system of a mirror projection type as a projection system.

As illumination light for exposure (that is, light rays from the light source 56), it is possible to use any of emission lines emitted from a mercury lamp (for example, the g-line or i-line), a KrF excimer laser (with a wavelength of 248 nm), an ArF excimer laser (with a wavelength of 193 nm), an $F_2$ laser (with a wavelength of 157 nm), an Ar2 laser (with a wavelength of 126 nm), harmonics from a YAG laser or the like.

Embodiments 1 to 5 have been described as an exposure technique preferable for use especially in the liquid crystal display panel substrate. However, the present invention is used not only for the liquid crystal display panel, but also as an exposure technique for use in manufacturing various types of semiconductor devices, a thin film magnetic head, and an image-pickup device (such as a CCD, or a CMOS sensor), and as an exposure technique for transferring a circuit pattern to a glass substrate or a silicon wafer in order to manufacture a reticle or a mask.

As described above, according to Embodiments 1 to 5, each time the exposure stage is driven in a step manner (the member is moved in a step manner), the member is exposed to newly form n columns of the exposure pattern and to perform the superposed exposure on the previously formed exposure pattern until the predetermined number of exposures is reached. This allows the use of the mask having the mask pattern columns, the number of which is smaller than the total number of the exposure pattern columns to be exposed on the member, thereby minimizing the length of the mask in the direction in which the mask pattern columns are arranged (the step movement direction of the member). This can reduce the deformation of the mask due to its own weight even when the mask is supported at its periphery to easily perform projection exposure on the large member at high resolution. Also, the cost of the mask can be reduced in association with a smaller size of the mask.

In addition, since the exposure pattern is subjected to the superposed exposure, the pattern exposure can be finally achieved with the required amount of exposure light even with a small light amount in each exposure. It is thus possible to relax the requirements of higher power of the light source, improved transmittance (reflectivity) of the projection optical system, and higher sensitivity of the photoresist applied to the member.

The light shielding members are used in the early and later phases of the repeated exposure to prevent light projection from some of the plurality of mask pattern columns to the member. This can prevent unnecessary exposure in the early and later phases of the repeated exposure when the exposure pattern is subjected to the superposed exposure.

The use of the mask including the first mask pattern for exposing the member to form the discontinuous pattern thereon and the second mask pattern for exposing the member to form the continuous pattern thereon allows simultaneous exposure for the discontinuous pattern and the continuous pattern. In addition, the step movement of the member ensures the continuity of the continuous pattern exposed on the member. Consequently, the repeated exposure for the discontinuous pattern and the exposure for the continuous pattern can be performed without separation as the single exposure process (one series of the exposure steps).

The third mask pattern is provided on the mask for exposing the member to form the single pattern thereon, so that it is possible to complete the exposure of the member to form the circuit patterns including the single pattern, the discontinuous (repeated) pattern, and the continuous pattern through the single exposure process (one series of the exposure steps) as the circuit pattern of the liquid crystal display panel substrate. Thus, while the mask is reduced in size to prevent deformation due to its own weight, transport of the member and alignment of the mask and the member are easily achieved, and throughput of the member can be improved.

While preferred embodiments have been described, it is to be understood that modifications and variations of the present invention may be made without departing from scope of the following claims.

What is claimed is:

1. A projection exposure apparatus which uses a mask including plural columns of a mask pattern for repeated exposure to a member to form plural columns of an exposure pattern thereon, said apparatus comprising:

an illumination system which irradiates light to the mask;

a projection system which projects the light from the mask onto the member;

an exposure stage which moves the member;

a mask stage which moves the mask; and a controller which controls light irradiation from the illumination system to the mask, driving of the exposure stage, and driving of the mask stage, wherein the controller alternately performs the light irradiation and step driving of the exposure stage for moving the member by a movement amount equal to n times a pitch of the columns of the exposure pattern, wherein the controller performs step driving of the mask stage for moving the mask by a movement amount equal to n times a pitch of the columns of the mask pattern in association with step driving of the exposure stage in an early phase and a later phase of the repeated exposure, and wherein n is a natural number smaller than the number of the columns of the mask pattern.

2. The projection exposure apparatus according to claim 1, further comprising:

a light shielding member which shields light to prevent light projection onto the member; and a light shielding member stage which moves the light shielding member, wherein the controller performs step driving of the light shielding member stage for moving the light shielding member by a movement amount corresponding to a pitch equal to n columns of the mask pattern in a light projection region on the member in association with step driving of the mask stage in the early phase and the later phase of the repeated exposure.

3. The projection exposure apparatus according to claim 1, wherein the mask includes plural columns of a first mask pattern for repeated exposure to the member to form plural columns of a discontinuous pattern thereon and a second mask pattern for exposure to the member to form a continuous pattern thereon.

4. The projection exposure apparatus according to claim 3, wherein the mask further includes a third mask pattern for exposure to the member to form a single pattern thereon.

5. The projection exposure apparatus according to claim 4, wherein the third mask pattern has a width which is a natural number multiple of a pitch of the columns of the first mask pattern.

6. A projection exposure apparatus which uses a mask including plural columns of a mask pattern for repeated exposure to a member to form plural columns of an exposure pattern thereon, said apparatus comprising:

an illumination system which irradiates light to the mask;

a projection system which projects the light from the illumination system onto the member;

an exposure stage which moves the member;

a light shielding member which shields light to prevent light projection onto the member from some of the plural columns of the mask pattern;

a light shielding member stage which moves the light shielding member; and a controller which controls light irradiation from the illumination system to the mask, driving of the exposure stage, and driving of the light shielding member stage, wherein the controller alternately performs the light irradiation and step driving of the exposure stage for moving the member by a movement amount equal to n times a pitch of the columns of the exposure pattern, wherein the controller performs step driving of the light shielding member stage for moving the light shielding member by a movement amount corresponding to a pitch equal to n columns of the mask pattern in a light projection region on the member in association with step driving of the exposure stage in an early phase and a later phase of the repeated exposure, and wherein n is a natural number smaller than the number of the columns of the mask pattern.

7. The projection exposure apparatus according to claim 6, wherein the mask includes plural columns of a first mask pattern for repeated exposure to the member to form plural columns of a discontinuous pattern thereon and a second mask pattern for exposure to the member to form a continuous pattern thereon.

8. The projection exposure apparatus according to claim 7, wherein the mask further includes a third mask pattern for exposure to the member to form a single pattern thereon.

9. The projection exposure apparatus according to claim 8, wherein the third mask pattern has a width which is a natural number multiple of a pitch of the columns of the first mask pattern.

10. A method of projection exposure comprising the steps of:
    a first step of preparing a mask including plural columns of a mask pattern for repeated exposure to a member to form columns of an exposure pattern thereon; and
    a second step of alternately performing light projection from the mask onto the member through light irradiation to the mask and step movement of the member for moving the member by a movement amount equal to n times a pitch of the columns of the exposure pattern,
    wherein, at the second step, the mask is moved in a step manner by a movement amount equal to n times a pitch of the columns of the mask pattern in association with the step movement of the member in an early phase and a later phase of the repeated exposure, and
    wherein n is a natural number smaller than the number of the columns of the mask pattern.

11. The method of projection exposure according to claim 10, wherein, at the second step, a light shielding region is formed to prevent light projection onto the member from some of the plural columns of the mask pattern, and the light shielding region is moved in a step manner by a movement amount corresponding to a pitch equal to n columns of the mask pattern in a light projection region on the member in association with step driving of the mask in the early phase and the later phase of the repeated exposure.

12. The method of projection exposure according to claim 10, wherein the mask includes plural columns of a first mask pattern for repeated exposure to the member to form plural columns of a discontinuous pattern thereon and a second mask pattern for exposure to the member to form a continuous pattern thereon.

13. The method of projection exposure according to claim 12, wherein the mask further includes a third mask pattern for exposure to the member to form a single pattern thereon.

14. The method of projection exposure according to claim 13, wherein the third mask pattern has a width which is a natural number multiple of a pitch of the columns of the first mask pattern.

15. A method of projection exposure comprising the steps of:
    a first step of preparing a mask including plural columns of a mask pattern for repeated exposure to a member to form plural columns of an exposure pattern thereon; and
    a second step of alternately performing light projection from the mask onto the member through light irradiation to the mask and step movement of the member for moving the member by a movement amount equal to n times a pitch of the columns of the exposure pattern,
    wherein, at the second step, a light shielding region is formed to prevent light projection onto the member from some of the plural columns of the mask pattern, and the light shielding region is moved in a step manner by a movement amount corresponding to a pitch equal to n columns of the mask pattern in a light projection region on the member in association with step driving of the member in an early phase and a later phase of the repeated exposure, and
    wherein n is a natural number smaller than the number of the columns of the mask pattern.

16. The method of projection exposure according to claim 15, wherein the mask includes plural columns of a first mask pattern for repeated exposure to the member to form plural columns of a discontinuous pattern thereon and a second mask pattern for exposure to the member to form a continuous pattern thereon.

17. The method of projection exposure according to claim 16, wherein the mask further includes a third mask pattern for exposure to the member to form a single pattern thereon.

18. The method of projection exposure according to claim 17, wherein the third mask pattern has a width which is a natural number multiple of a pitch of the columns of the first mask pattern.

19. A method of manufacturing an exposed member, comprising the steps of:
    a first step of preparing a mask including plural columns of a mask pattern for repeated exposure to a member to form plural columns of an exposure pattern thereon; and
    a second step of alternately performing light projection from the mask onto the member through light irradiation to the mask and step movement of the member for moving the member by a movement amount equal to n times a pitch of the columns of the exposure pattern,
    wherein, at the second step, the mask is moved in a step manner by a movement amount equal to n times a pitch of the columns of the mask pattern in association with the step movement of the member in an early phase and a later phase of the repeated exposure, and
    wherein n is a natural number smaller than the number of the columns of the mask pattern.

20. The method of manufacturing an exposed member according to claim 19, wherein, at the second step, a light shielding region is formed to prevent light projection onto the member from some of the plural columns of the mask pattern, and the light shielding region is moved in a step maimer by a movement amount corresponding to a pitch equal to n columns of the mask pattern in a light projection region on the member in association with step driving of the mask in the early phase and the later phase of the repeated exposure.

21. The method of manufacturing an exposed member according to claim 19,
    wherein the mask includes plural columns of a first mask pattern for repeated exposure to the member to form plural columns of a discontinuous pattern thereon and a second mask pattern for exposing the member to form a continuous pattern thereon.

22. The method of manufacturing an exposed member according to claim 21, wherein the mask further includes a third mask pattern for exposure to the member to form a single pattern thereon.

23. The method of manufacturing an exposed member according to claim 22, wherein the third mask pattern has a width which is a natural number multiple of a pitch of the columns of the first mask pattern.

24. A method of manufacturing an exposed member, comprising the steps of:
- a first step of preparing a mask including plural columns of a mask pattern for repeated exposure to a member to form plural columns of an exposure pattern thereon; and
- a second step of alternately performing light projection from the mask onto the member through light irradiation to the mask and step movement of the member for moving the member by a movement amount equal to n times a pitch of the columns of the exposure pattern,
- wherein, at the second step, a light shielding region is formed to prevent light projection onto the member from some of the plural columns of the mask pattern, and the light shielding region is moved in a step manner by a movement amount corresponding to a pitch equal to n columns of the mask pattern in a light projection region on the member in association with step driving of the member in an early phase and a later phase of the repeated exposure, and
- wherein n is a natural number smaller than the number of the columns of the mask pattern.

25. The method of manufacturing an exposed member according to claim 24, wherein the mask includes plural columns of a first mask pattern for repeated exposure to the member to form plural columns of a discontinuous pattern thereon and a second mask pattern for exposure to the member to form a continuous pattern thereon.

26. The method of manufacturing an exposed member according to claim 25, wherein the mask further includes a third mask pattern for exposure to the member to form a single pattern thereon.

27. The method of manufacturing an exposed member according to claim 26, wherein the third mask pattern has a width which is a natural number multiple of a pitch of the columns of the first mask pattern.

* * * * *

UNITED STATES PATENT AND TRADEMARK OFFICE
CERTIFICATE OF CORRECTION

PATENT NO.       : 7,158,210 B2
APPLICATION NO.  : 10/762481
DATED            : January 2, 2007
INVENTOR(S)      : Kazuo Iizuka et al.

It is certified that error appears in the above-identified patent and that said Letters Patent is hereby corrected as shown below:

COLUMN 11:
 Line 48, "abovedescribed" should read -- above-described --.

COLUMN 14:
 Line 4, "fifth" should read -- first --.
 Line 64, "T1$a$"should read -- T1$a'$ --.
 Line 66, "T1$a$"should read -- T1$a'$ --.
 Line 67, "T1$b$"should read -- T1$b'$ --.

COLUMN 15:
 Line 3, "T1$b$"should read -- T1$b'$ --.
 Line 4, "T1$b$"should read -- T1$b'$ --.
 Line 16, the first occurrence of "T1$a$"should read -- T1$a'$ --.
 Line 19, "T1$b$"should read -- T1$b'$ --.
 Line 22, "1L," should read -- 1L$'$ --.
 Line 30, "T1$a$"should read -- T1$a'$ --.
 Line 32, ""T1$b$"should read -- T1$b'$ --.
 Line 42, "(1L to 4L" should read -- (1L$'$ to 4L$'$) --.
 Line 45, "(5L" should read -- (5L$'$ --.

COLUMN 16:
 Line 1, "2L to 5L" should read -- 2L$'$ to 5L$'$ --.
 Line 2, "2L to 5L" should read -- 2L$'$ to 5L$'$ --.
 Line 8, "3L to 5L" should read -- 3L$'$ to 5L$'$ --.
 Line 9, "T2$a$"should read -- T2$a'$ --.
 Line 10, "T2$a$"should read -- T2$a'$ -- and "3L to 5L" should read -- 3L$'$ to 5L$'$ --.
 Line 11, "T2$b$"should read -- T2$b'$ --.
 Line 17, "(5L" should read -- (5L$'$) --.
 Line 19, "T2$a$ and T2$b$"should read -- T2$a'$ and T2$b'$ --.

UNITED STATES PATENT AND TRADEMARK OFFICE
CERTIFICATE OF CORRECTION

PATENT NO. : 7,158,210 B2
APPLICATION NO. : 10/762481
DATED : January 2, 2007
INVENTOR(S) : Kazuo Iizuka et al.

It is certified that error appears in the above-identified patent and that said Letters Patent is hereby corrected as shown below:

<u>COLUMN 17:</u>
Line 42, "aforementioned-exposure" should read -- aformentioned exposure --.

Signed and Sealed this

Twenty-second Day of May, 2007

JON W. DUDAS
*Director of the United States Patent and Trademark Office*